United States Patent [19]
Saito

[11] Patent Number: 5,210,712
[45] Date of Patent: May 11, 1993

[54] WAVEFORM SHAPING CIRCUIT AND DIGITAL SIGNAL ANALYZING APPARATUS USING THE SAME

[75] Inventor: Sumio Saito, Atsugi, Japan
[73] Assignee: Anritsu Corporation, Tokyo, Japan
[21] Appl. No.: 764,158
[22] Filed: Sep. 20, 1991

[30] Foreign Application Priority Data

Sep. 29, 1990 [JP] Japan ................................. 2-261875
Sep. 29, 1990 [JP] Japan ................................. 2-261876

[51] Int. Cl.$^5$ ........................................... G06G 7/02
[52] U.S. Cl. ................................................. 364/825
[58] Field of Search ..................... 364/825, 724.01; 328/164; 375/20

[56] References Cited

U.S. PATENT DOCUMENTS

| | | | |
|---|---|---|---|
| 4,525,667 | 6/1985 | Sawano et al. | 324/140 R |
| 4,635,277 | 1/1987 | Blake et al. | 375/20 |
| 4,639,618 | 1/1987 | Olesen | 307/351 |
| 4,639,681 | 1/1987 | Hasegawa | 328/164 |
| 4,726,035 | 2/1988 | Bullock et al. | 364/825 X |
| 4,912,470 | 3/1990 | Hosotani et al. | 341/159 |

FOREIGN PATENT DOCUMENTS

| | | |
|---|---|---|
| 3120622 | 12/1982 | Fed. Rep. of Germany . |
| 58-30275 | 2/1983 | Japan . |
| 1309570 | 3/1973 | United Kingdom . |
| 1599459 | 10/1981 | United Kingdom . |

Primary Examiner—Long T. Nguyen
Attorney, Agent, or Firm—Frishauf, Holtz, Goodman & Woodward

[57] ABSTRACT

A waveform shaper includes a level shifter for controlling a DC offset voltage of an input digital signal, a comparator for comparing a digital signal output from the level shifter with a predetermined reference voltage to shape a waveform of the input digital signal and output a shaped digital signal, an intermediate voltage detector for detecting and outputting an intermediate voltage of a digital signal output from the level shifter, and a first controller for receiving the intermediate voltage and the predetermined reference voltage to output a control signal for changing the DC offset voltage to the level shifter. A signal analyzer includes, in addition to the above waveform shaper, a variable delay circuit for delaying a phase of an input clock signal, a discriminator for receiving an output from the comparator and an output from the variable delay circuit to determine a code of the output signal from the comparator at a timing determined by a delayed clock signal, an error measuring unit for comparing a determination signal from the discriminator with a reference signal corresponding to the input digital signal to output an error signal, and a second controller for receiving a output from the error measuring unit, detecting an intermediate delay amount of delay amounts corresponding to adjacent error signals having maximum values, and sending the intermediate delay amount to the variable delay circuit.

21 Claims, 25 Drawing Sheets

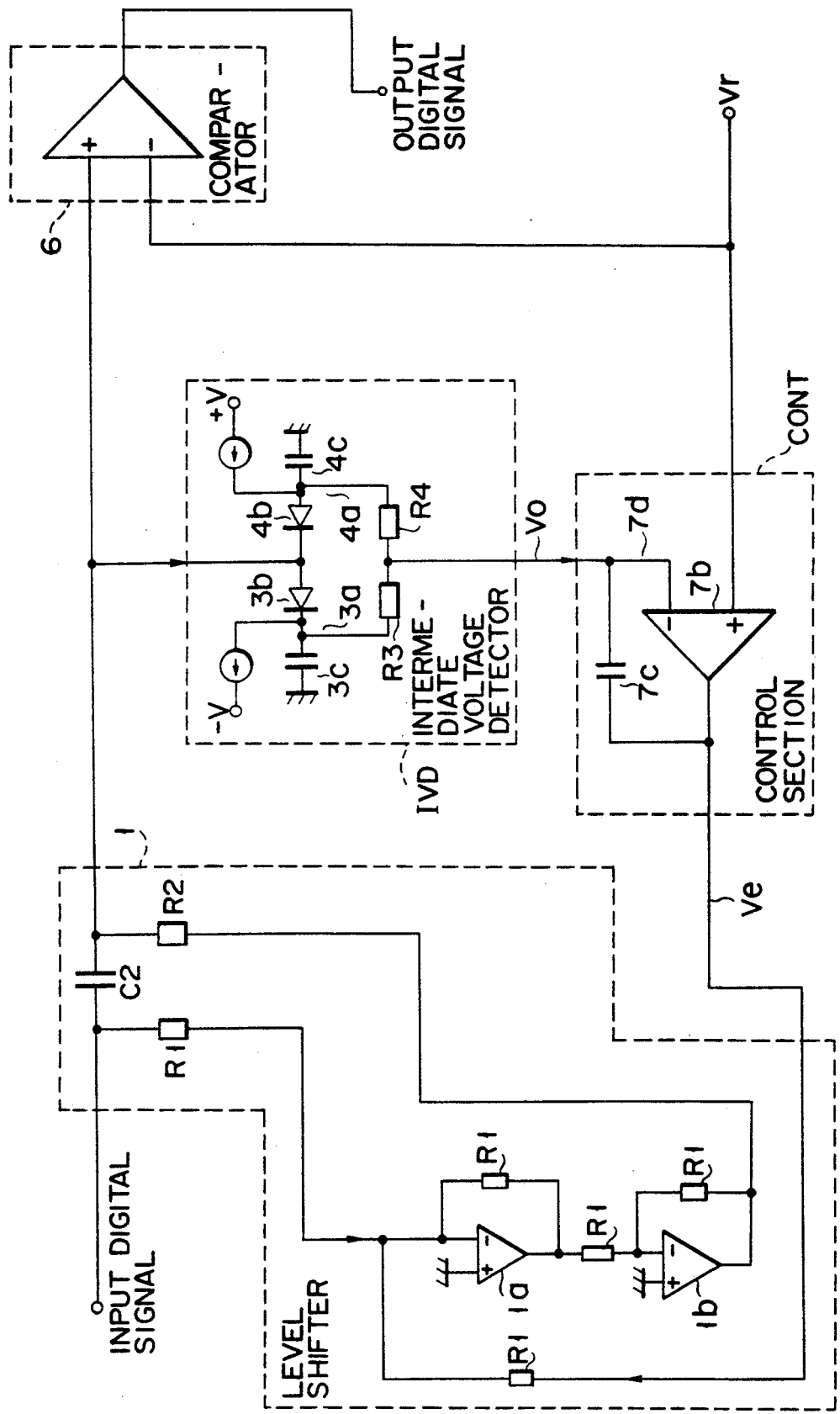
F I G. 2C

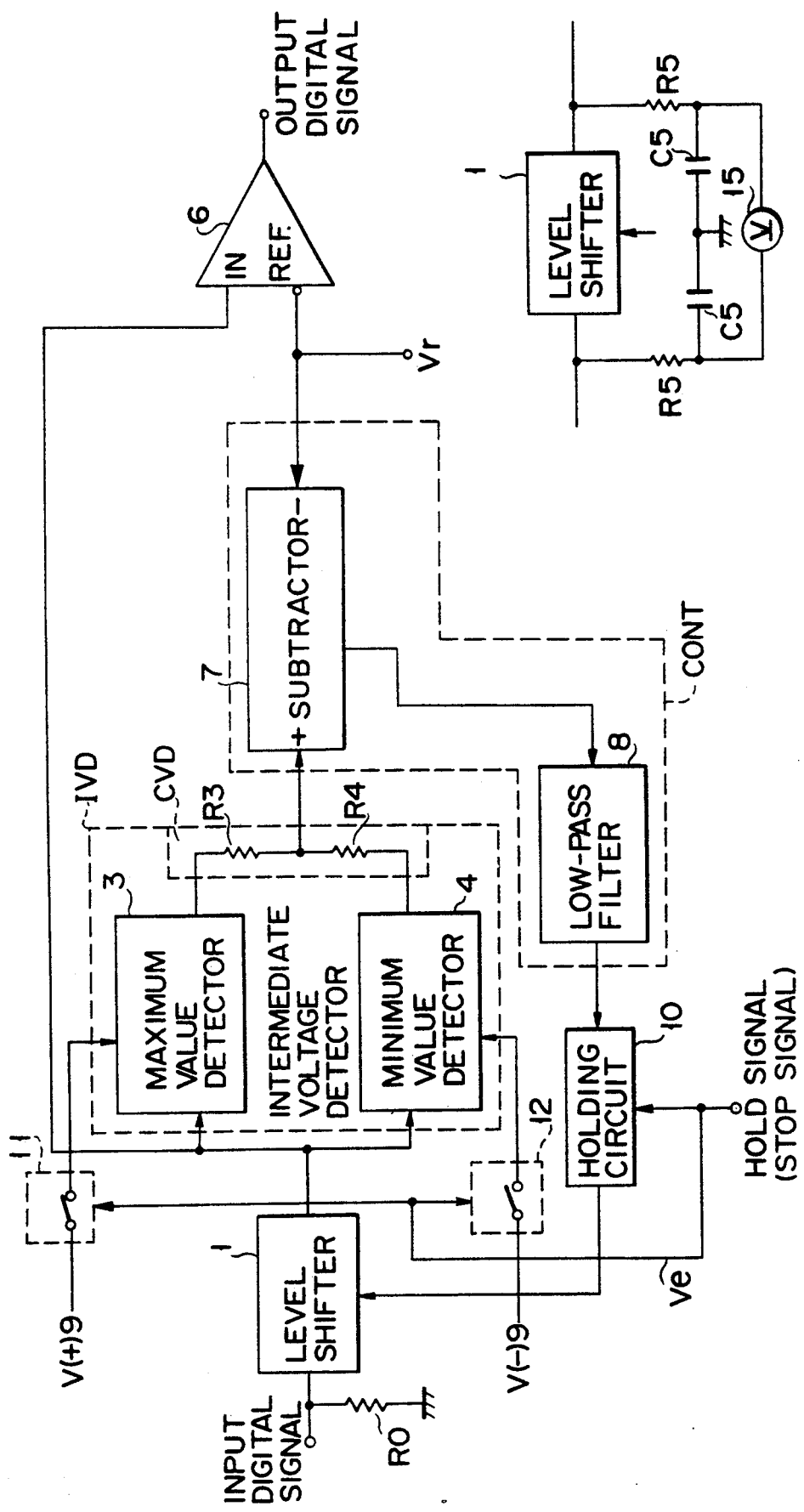

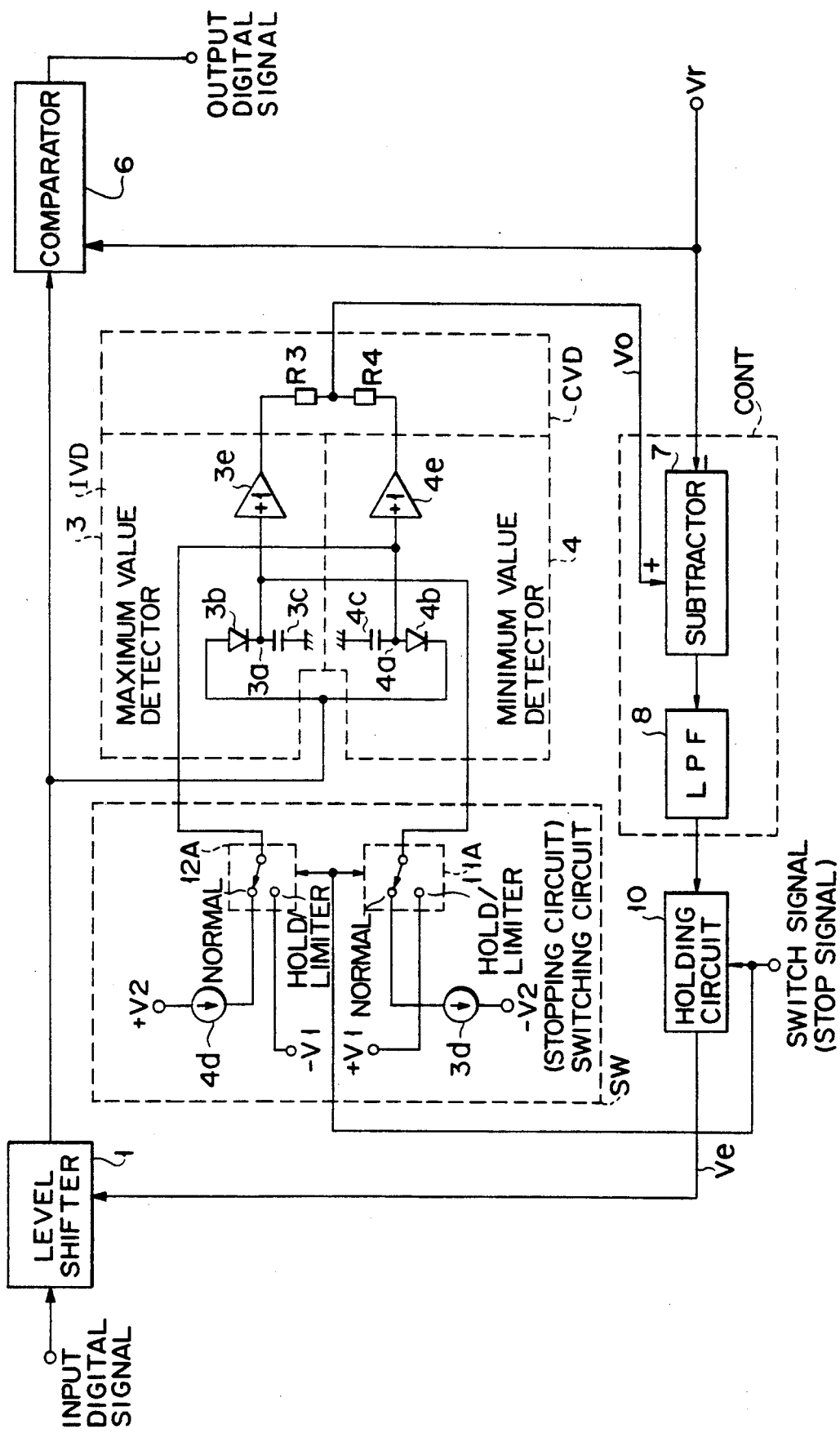
F I G. 5A

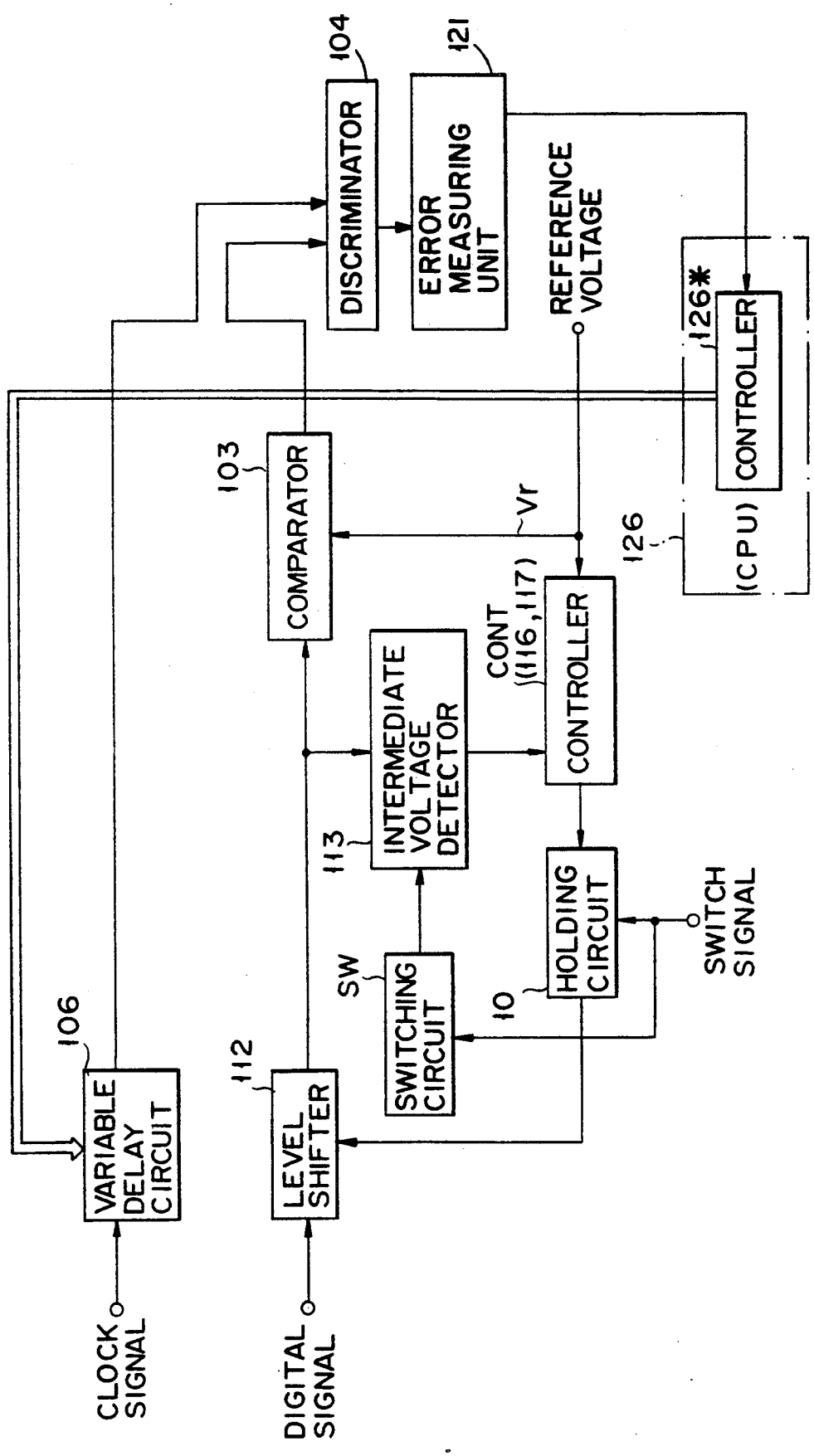
F I G. 14

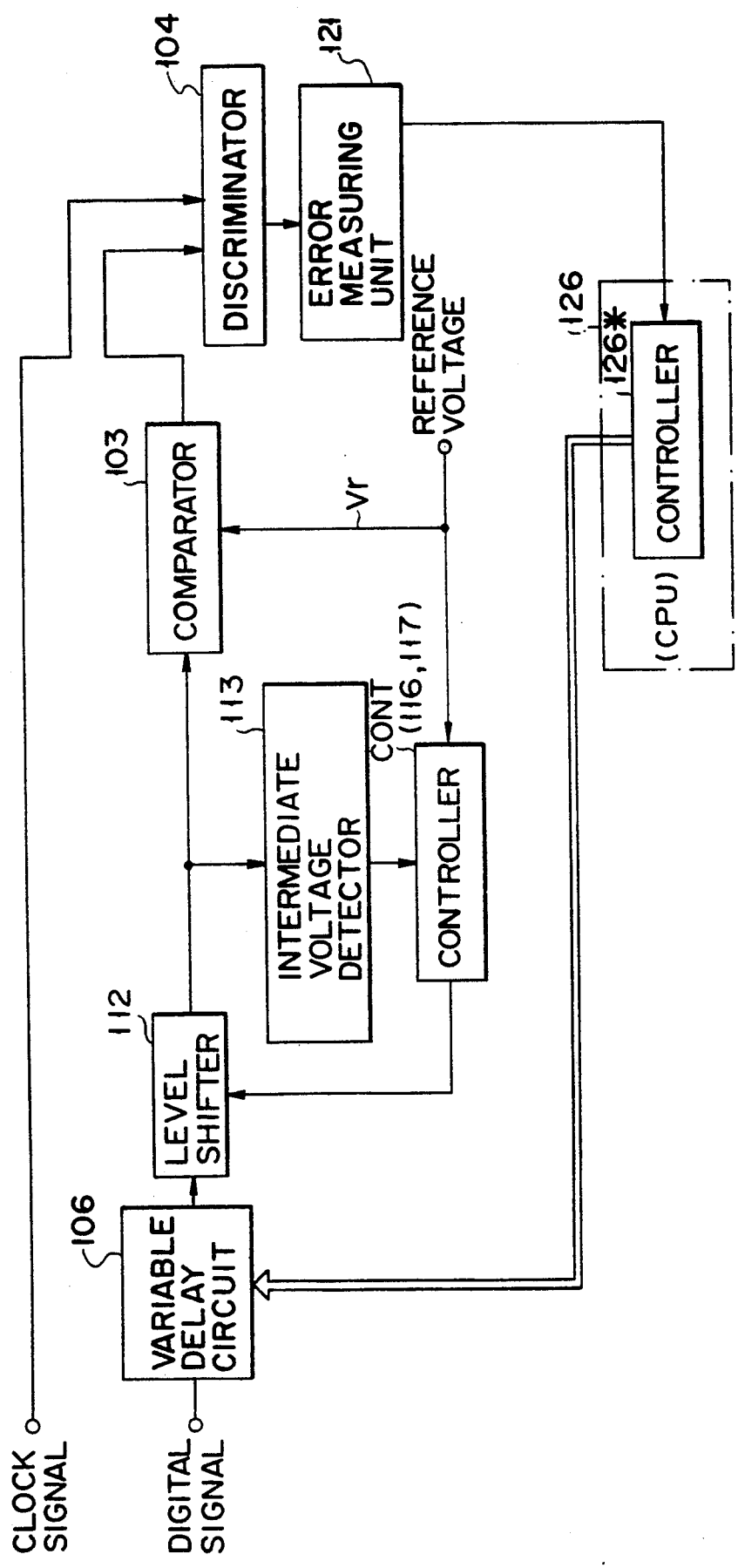
F I G. 16

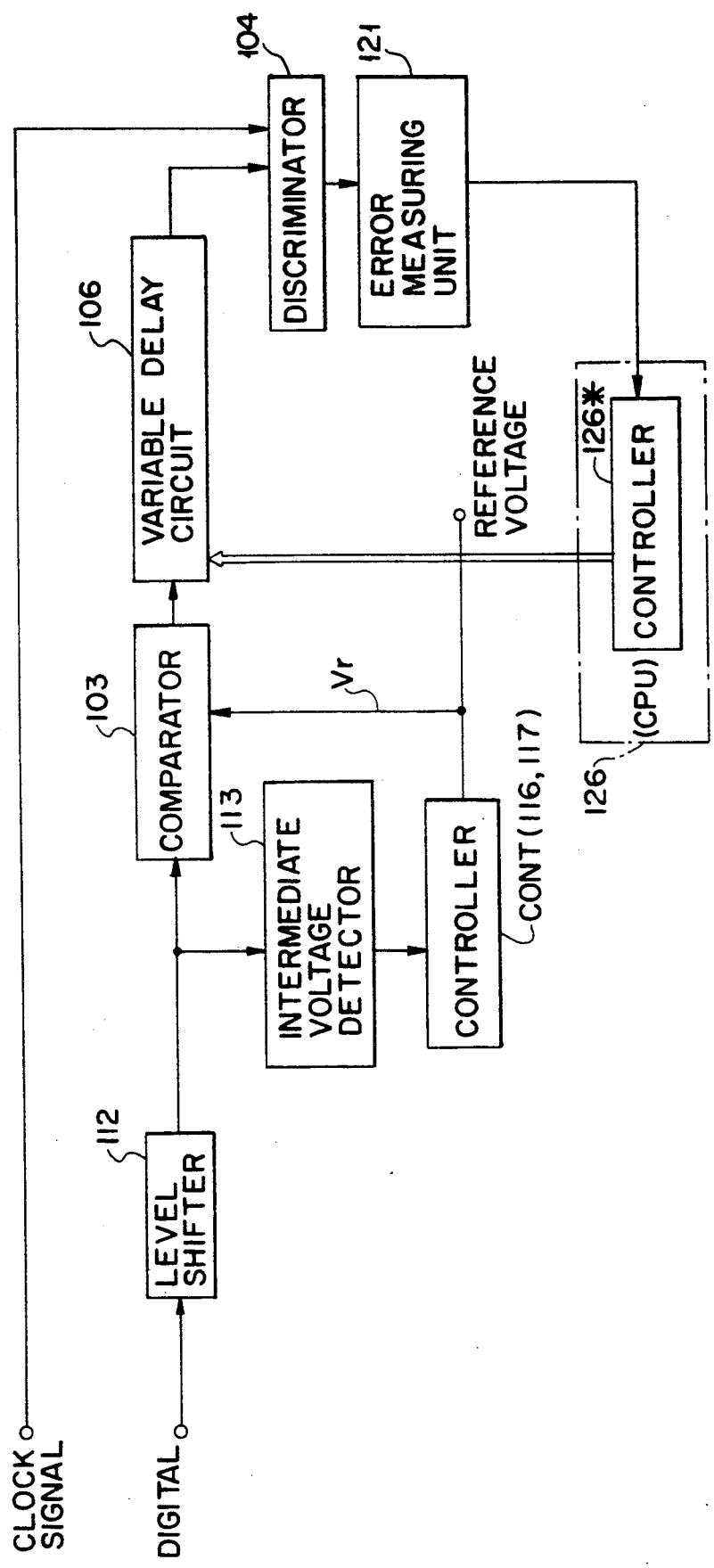
F I G. 17

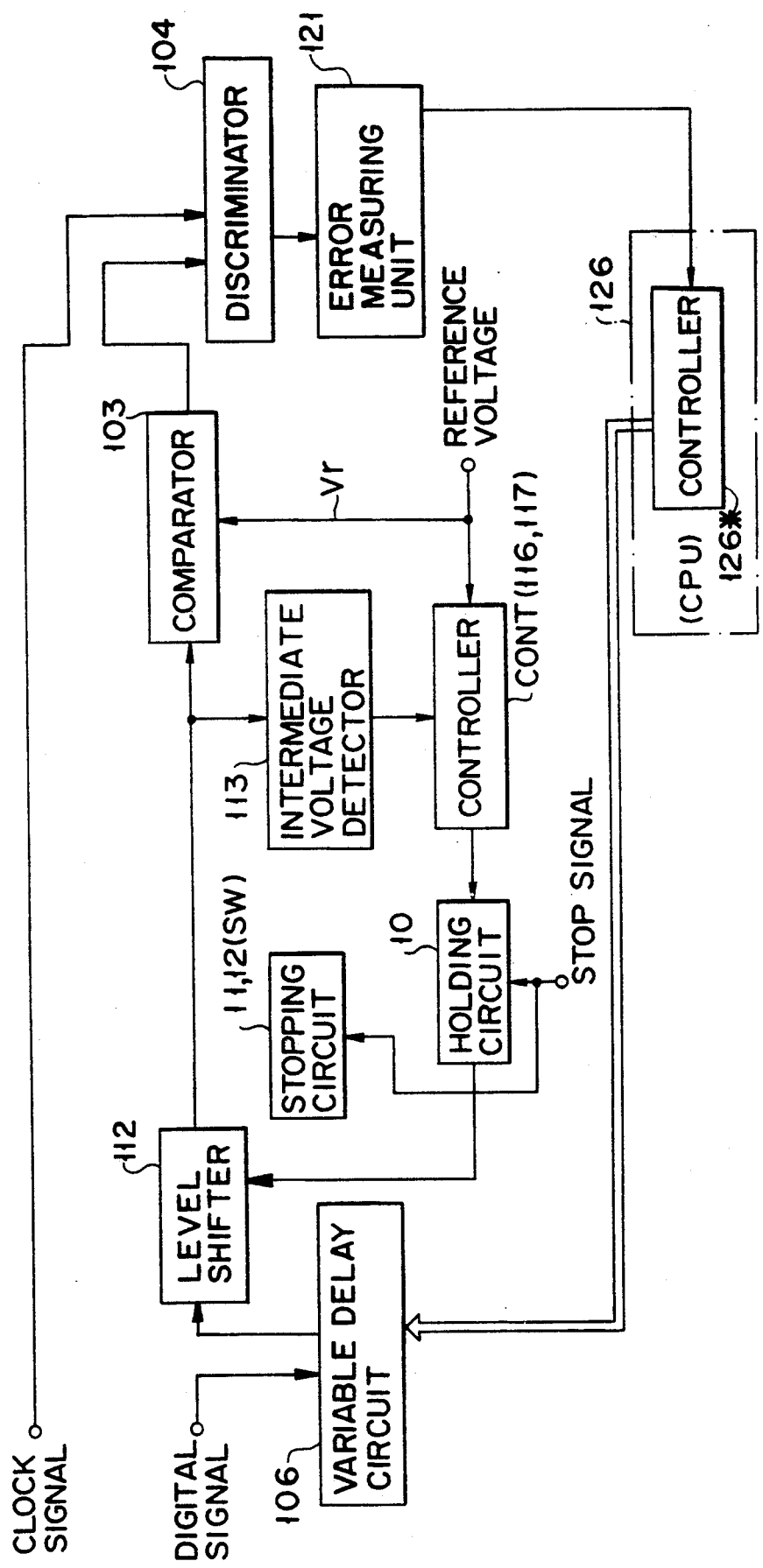
F I G. 18

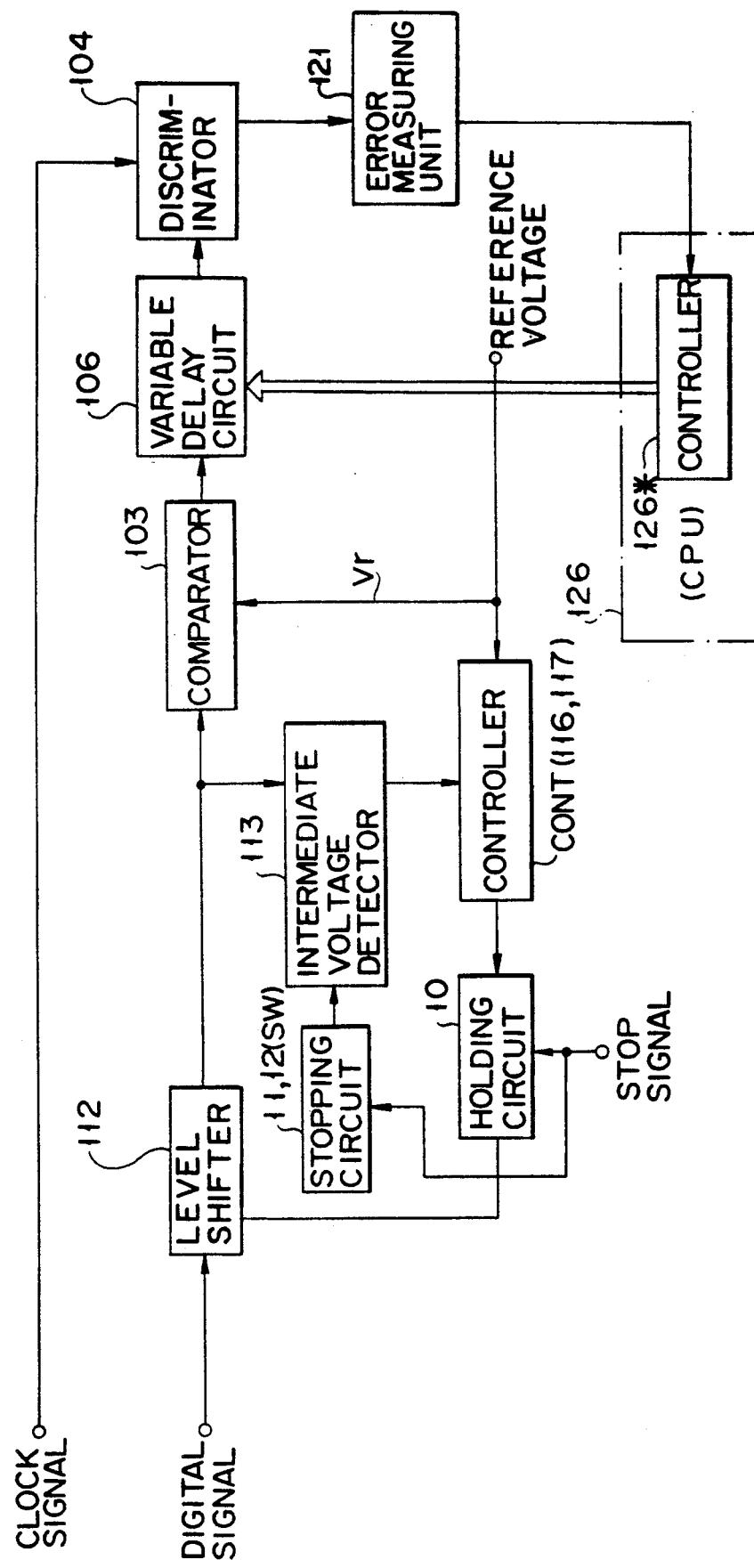
F I G. 19

WAVEFORM SHAPING CIRCUIT AND DIGITAL SIGNAL ANALYZING APPARATUS USING THE SAME

BACKGROUND OF THE INVENTION

1. Field of the Invention

The present invention relates to a waveform shaping circuit and a digital signal analyzing apparatus using the same and, more particularly, to a digital signal waveform shaping circuit for waveform-shaping an input digital signal and outputting a shaped digital signal and a digital signal analyzing apparatus, such as a logic analyzer or an error measuring apparatus, for analyzing a data signal to be measured input in synchronism with a clock signal by using the digital signal waveform shaping circuit.

2. Description of the Related Art

In general, in the above digital signal analyzing apparatus, when a digital signal received from an external circuit is analyzed, a waveform shaping circuit using a comparator is conventionally utilized not to perform wrong binary determination caused by an offset and noise components superposed on a digital signal.

In the waveform shaping circuit of this type, an operating point of a comparator used in the waveform shaping circuit must be set to be an ideal and stable operating point free from the offset of an input digital signal and an influence of noise. For this reason, the following conventional methods are used:

(1) a technique of manually setting a threshold value level of the comparator in an optimal state while an output waveform of the comparator is monitored;

(2) a technique of inputting an input digital signal to the comparator through a capacitor; and (3) a technique of manually changing a DC average level of the input digital signal into a predetermined level using a level shifter to input the digital signal to the comparator.

However, according to the techniques (1) and (3), the manual setting operation of the operating point is cumbersome, and the setting operation must be performed every time the level or offset of the input signal is changed.

According to the technique (2), since the offset voltage of the digital signal input to the comparator is changed in accordance with a mark ratio (a ratio of the number of all generated bits to the number of marks included in the bits) of the input digital signal, waveform shaping is not reliably performed at a fixed threshold value For this reason, another technique of inputting an intermediate voltage between the high- "H" and low- "L" level voltages of an input digital signal to the comparator as a threshold value may be used. However, according to this technique, when the input digital signal has a very high frequency (several GHz), the in-phase input range of the comparator is extremely narrow (e.g., ±1 V). When the offset voltage of the input digital signal exceeds the in-phase input range, the comparator is saturated, and a normal waveform shaping operation cannot be performed.

A digital analyzing apparatus such as a logic analyzer or an error (rate) measuring apparatus using the above waveform shaping circuit is generally arranged as shown in FIG. 22.

That is, a data signal to be measured input to an input terminal 1 and a reference voltage Vr from a reference voltage generator 2 are input to a comparator 3, and a binary digital signal from which waveform distortion or a noise component are removed by the comparator 3 is input to the data input terminal (to be referred to as a D terminal) of a discriminator 4 constituted by a D flip-flop.

A clock signal input to an input terminal 5 is input to the clock terminal (to be referred to as a CP terminal) of the discriminator 4 through a variable delay circuit 6.

Therefore, binary discrimination of the digital signal from the comparator 3 is performed at a rise timing of the cock signal input to the discriminator 4, the determination output and the clock signal are input to a data signal analyzer 7, and a predetermined data analysis is performed.

However, since the level of the data signal to be measured input to the input terminal 1 and the phase of the clock signal are not known, before the normal data analyzing operation, the value of the reference voltage and a delay amount of the clock signal must be set to be optimal values with respect to the data signal to be measured in advance.

For this reason, in a conventional technique, a data signal to be measured shown in FIG. 23A is displayed on an oscilloscope, and the reference voltage Vr is adjusted to be positioned at an almost center point (point having a maximum noise margin of an eye-pattern) of the amplitude of the data s gnal to be measured. Thereafter, an output signal from the comparator 3 shown in FIG. 23B and a clock signal shown in FIG. 23C are displayed on a two-channel oscilloscope, and a delay amount of the variable delay circuit 6 is manually adjusted such that the rise timing (discrimination timing of the discriminator 4 of the clock signal is positioned at an almost intermediate point (having a maximum phase margin) between state transition points I and II of the digital signal.

When the delay amount is manually adjusted as described above, the delay amount depends on individual differences of operators, thereby varying the analysis result.

When the adjustment is to be performed by observing a waveform using an oscilloscope, not only connections between devices are cumbersome, but the waveform of a signal is distorted by connecting the oscilloscope to cause an erroneous operation.

For this reason, a method of connecting a monitor terminal for observing a waveform is may be used. However, waveform observing equipment such as an oscilloscope must be prepared as usual. This is very inconvenient.

SUMMARY OF THE INVENTION

It is, therefore, an object of the present invention to provide a new and improved waveform shaping circuit which can perform a simple and reliable waveform shaping operation even in a very high frequency region.

It is also another object of the present invention to provide a new and improved digital signal analyzing apparatus using the above mentioned waveform shaping circuit which can ensure simple and accurate signal analysis even in a very high frequency region.

According to a first aspect of the present invention, there is provided a waveform shaping circuit comprising: a level shifter for variably controlling a C offset voltage of an input digital signal; a comparator for comparing a digital signal output from the level shifter with a predetermined reference voltage so as to shape a waveform of the input digital signal and outputting a shaped digital signal; intermediate voltage detecting means for detecting and outputting an intermediate voltage between high- and low-leve voltages of a digital signal output from the level shifter; and control means for receiving the intermediate voltage output from the intermediate voltage detecting means and the predetermined reference voltage and outputting a control signal for changing the DC offset voltage to equalize the intermediate voltage to the predetermined reference voltage, to said level shifter.

According to a second aspect of the present invention, there is provided a signal analyzing apparatus comprising: a level shifter for variably controlling a DC offset voltage of an input digital signal; a comparator for comparing a digital signal output from the level shifter with a predetermined reference voltage so as to shape a waveform of the input digital signal and outputting a shaped digital signal; intermediate voltage detecting means for detecting and outputting an intermediate voltage between high- and low-level voltages of a digital signal output from the level shifter; first control mean for receiving the intermediate voltage output from the intermediate voltage detecting means and the predetermined reference voltage and outputting a control signal for changing the DC offset voltage to equalize the intermediate voltage to the predetermined reference voltage to the level shifter; a variable delay circuit for delaying a phase of an input clock signal; a discriminator for receiving an output from the comparator and a output from the variable delay circuit and determining a code of the output signal from the comparator at a timing determined by a delayed clock signal delayed by the variable delay circuit; an error measuring unit for comparing a determination signal from the discriminator with a reference signal cor responding to the input digital signal and outputting an error signal; and second control means for receiving an output from the error measuring unit, detecting an intermediate delay amount of delay amounts corresponding to error signals having maximum values adjacent to each other, and sending the intermediate delay amount to the variable delay circuit, to thereby reduce the error signal output from the error measuring unit.

According to a third aspect of the present invention, there is provided a waveform shaping circuit comprising a level shifter for changing an average DC offset voltage of an input digital signal, a comparator for comparing a digital signal output from the level shifter with a predetermined threshold voltage to output a waveform-shaped digital signal, a maximum value detector for detecting a maximum value of the digital signal from the level shifter, a minimum value detector for detecting a minimum value of the digital signal form the level shifter, and a subtractor for subtracting a center value between the maximum value from the maximum value detector and the minimum value from the minimum value detector from the predetermined threshold value to output an error signal corresponding to the subtraction result to the level shifter, thereby controlling a shift amount of the level shifter such that the center value is close to the predetermined threshold value.

Therefore, in the waveform shaping circuit according to this aspect, the center value of the digital signal input from the level shifter to the comparator is always controlled to be close to the predetermined threshold value of the comparator independently of an offset of the input signal, and a waveform-shaped digital signal is output from the comparator.

In order to solve the above problems, according to a fourth aspect of the present invention, there is provided a digital signal analyzing apparatus for shaping a waveform by comparing a date signal to be measured with a reference voltage using a comparator and for analyzing the data signal to be measured on the basis of a binary digital signal output from the comparator, comprising intermediate voltage detecting means for detecting H- and L-level peak voltages of the data signal to be measured and outputting an intermediate voltage between two peak voltages to the comparator as a reference voltage.

According to a fifth aspect of the present invention, there is provided a digital signal analyzing apparatus for shaping a waveform by comparing a date signal to be measured with a reference voltage using a comparator and for analyzing the data signal to be measured on the basis of a binary digital signal output from the comparator, comprising a level shifter for changing an average D offset voltage of the data signal to be measured and outputting the data signal, intermediate voltage detecting means for detecting H- and L-level peak voltages of the data signal output from the level shifter to the comparator and outputting an intermediate voltage between two peak voltages, and shift amount control means for variably controlling a shift amount of the level shifter such that the intermediate value from the intermediate voltage detecting means is close to the predetermined reference value of the comparator.

According to a sixth aspect of the present invention, there is provided a digital signal analyzing apparatus comprising a discriminator for discriminating a logic state of a binary digital signal output from a comparator at a discrimination timing synchronized with a clock signal, a variable deay circuit for delaying the clock signal input to the discriminator by a delay amount corresponding to a control signal, and delay amount setting means for detecting a delay amount for positioning the discrimination timing between adjacent state transition points of the binary digital signal on the basis of an analysis result obtained by changing the delay amount of the variable delay circuit within a predetermined range so as to set the detected delay amount in the variable delay circuit.

According to the fourth aspect, the center value between the peak voltages of the data signal to be measured is always input as the reference voltage of the comparator.

According to the fifth aspect, the shift amount of the level shifter is controlled such that the center value between the peak voltages of the data signal to be measured input to the comparator is always close to the reference voltage of the comparator.

According to the sixth aspect, the delay amount for positioning the discrimination timing of the discriminator between adjacent state transition points of the comparator output is determined on the basis of the analysis result obtained by changing the delay amount of the clock signal within a predetermined range.

Additional objects and advantages of the invention will be set fourth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing an arrangement of the first embodiment ,of the present invention;

FIGS. 2A, 2B, 2C are circuit diagrams showing different main parts of the first embodiment;

FIG. 4 is a block diagram showing an arrangement of a modification of the present invention;

FIGS. 5A, 5B, 5C, and 6are circuit diagrams showing main parts of other modifications of the present invention;

FIGS. 12, 12, 14, 15, 16, 17, 18, 19 and 20 are block diagrams showing a basic arrangement of the second embodiment of the present invention and arrangements of several modifications of the present invention;

DETAILED DESCRIPTION OF THE PREFERRED EMBODIMENTS

Figures 1, 2A:
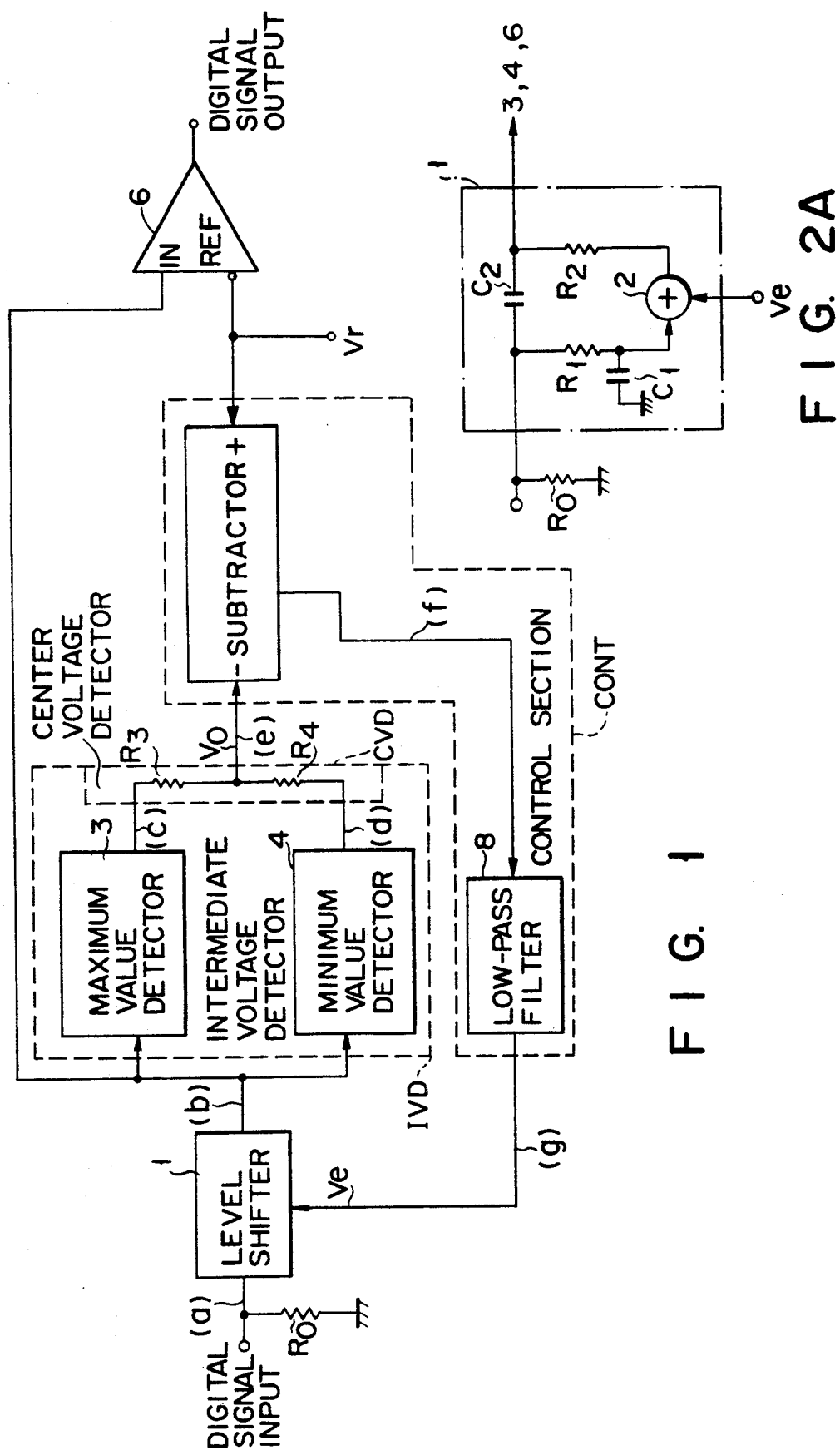

Reference will now be made in detail to the presently preferred embodiments of the invention as illustrated in the accompanying drawings, in which like reference characters designate like or corresponding parts throughout the several drawings.

The first embodiment of the present invention will be described below with reference to the accompanying drawings.

FIG. 1 is a circuit diagram showing an arrangement of a waveform shaping circuit according to the first embodiment of the present invention.

In FIG. 1, a leve shifter 1 changes an average DC (offset) voltage level of an input digital signal pulled down to an input resistor $R_0$ (e.g.,50 $\Omega$) in accordance with the magnitude of an error signal Ve (to be described later). The level shifter 1, as shown in FIG. 2A, is arranged such that an adder 2 adds the error signal to the average voltage of the input digital signal detected by an integrator constituted by a resistor $R_1$ and a capacitor $C_1$ and that the added voltage is added to an input digital signal, the DC component of which is blocked by a capacitor R2.

Each of the resistors $R_1$ and $R_2$ has a high resistance of about several tens K$\Omega$, which does not influence a transmission impedance of 50 $\Omega$.

In FIG. 1, a maximum value detector 3 detects the peak value of the maximum voltage of an output signal from the level shifter 1. The maximum value detector 3, as shown in FIG. 2B, is constituted by a diode detector (detecting a waveform in a positive voltage direction) 3a.

A minimum value detector 4 detects the peak value the minimum voltage of the output signal from the level shifter 1. The minimum value detector 4, as shown in FIG. 2B, as in the maximum value detector 3, is constituted by a diode detector (deteting a waveform in a negative voltage direction) 4a.

Figure 2B:
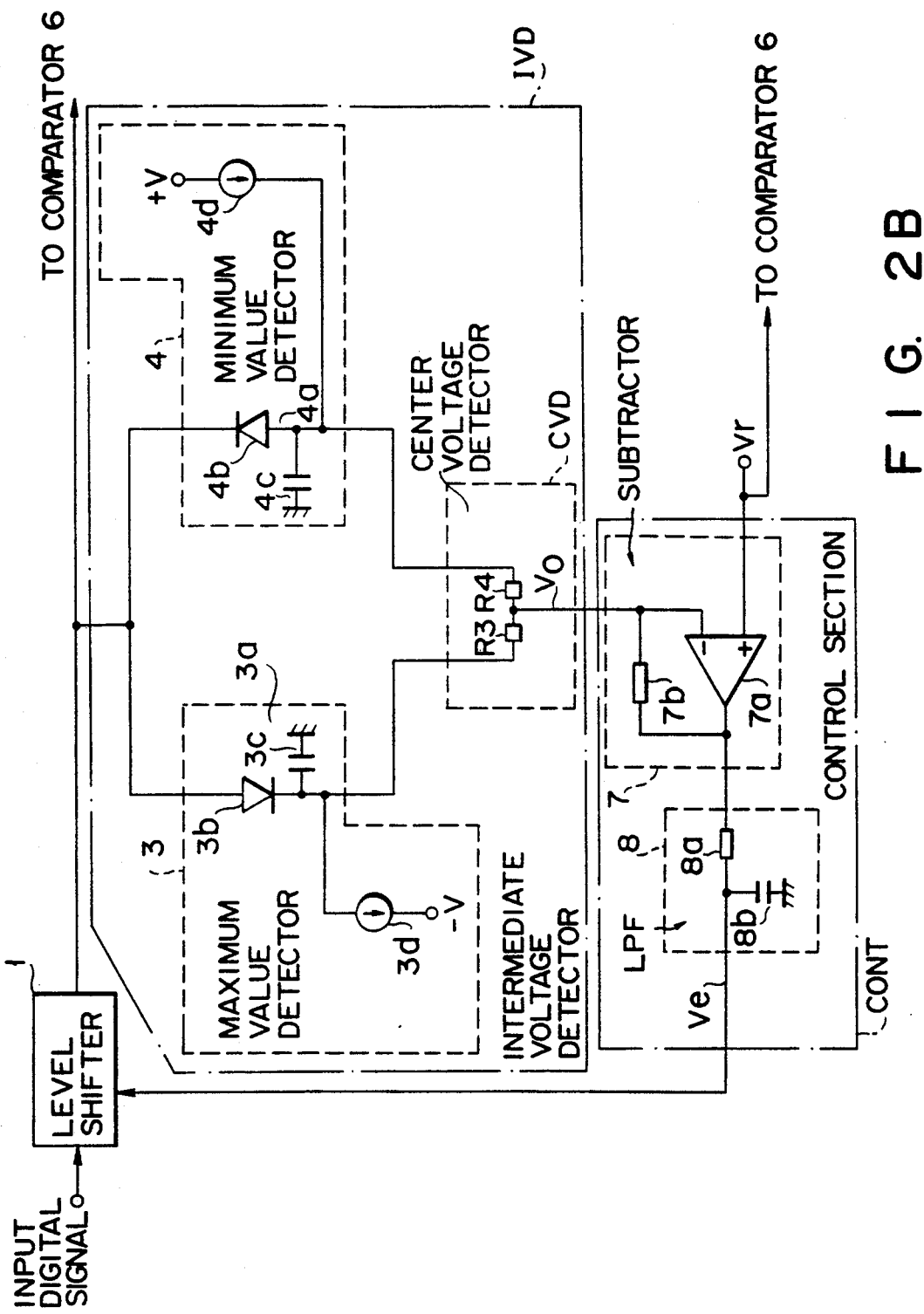

Outputs from the detectors 3 and 4 are connected to the two ends of series-connected resistors $R_3$ and $R_4$ having equal resistances indicated as a center voltage detecting section (CVD) in FIG. 2B.

Note that an intermediate voltage detecting section (IVD) is constituted by the detectors 3 and 4 and the resistors $R_3$ and $R_4$.

A comparator 6 outputs a high- ("H") level digital signal when the level of an output signal supplied from the level shifter 1 to an input terminal IN of the comparator 6 is higher than that of a predetermined threshold value voltage Vr applied to an input terminal REF of the comparator 6. When the level of the output signal is lower than that of the threshold value voltage Vr, the comparator 6 outputs a low- ("L") level digital signal. The comparator 6 is constituted by a very-high-frequency semiconductor element (e.g., a gallium arsenide FET) or the like.

A subtractor 7, as shown in FIG. 2B, is constituted by a differential amplifier 7a and a feedback resistor 7b. The subtractor 7 subtracts an center voltage (intermediate voltage) $V_0$ between the output from the maximum value detector 3 and the output from the minimum value detector 4 from the threshold voltage Vr of the comparator 6. The center voltage $V_0$ is output from the connection point between the resistors $R_3$ and $R_4$.

A low-pass filter 8 determines response characteristics of an output from the subtractor 7 with respect to the level shifter 1. The low-pass filter (LPF) 8, as shown in FIG. 2B, comprises an integrator constituted by a resistor 8a and a capacitor 8b. A control section CONT for controlling the level shifter 1 is constituted by the subtractor 7 and the low-pass filter 8.

The maximum value detector 3 and the minimum value detector 4 shown in FIG. 2B will be described below.

In the maximum value detector 3, the positive voltage direction diode detector 3a includes a forwardbiased diode 3b and a capacitor 3c which are connected in series between the output terminal of the level shifter 1 and ground. In addition, the detector 3a includes a constan current source 3d connected between the connection point of the diode 3b and the capacitor 3C and the a negative power source —V.

In the minimum value detector 4, the negative voltage direction diode detector 4a includes a reversebiased diode 4b and a capacitor 4c which are connected in series between the output terminal of the level shifter 1 and the ground. In addition, the detector 4a includes a constant current source 4d connected between the connection point of the diode 4b and the capacitor 4c and a positive power source +V.

In the diode detectors 3a and 4a, the constant current sources 3d and 4d applies a small forward-biasing current of, e.g., about 1 μA, to each of the diodes 3b and 4b. In this case, the detector 3a detects a highlevel voltage (maximum value), which is larger than the negative power source −V, of the digital signal output from the level shifter, and the detector 4a detects a low-level voltage (minimum value) smaller than the positive power source +V output. The capacitors 3c and 4c hold the maximum and minimum values, respectively. The capacitance of each of the capacitors 3c and 4c is set to be a value of, e.g., about 1,000 pF enough to hold a digital signal having a repetition period of 1 kHz or more, since a forward-biasing current supplied to each of the diodes 3b and 4b is 1 μA.

In this case, the forward-biasing current to each of the diodes 3b and 4b has a small current value which rarely influences the input digital signal, and this current value is set as a current value required for a detecting operation of each of the diodes 3b and 4b.

FIG. 2C shows still another arrangement of the first embodiment of the present invention. In FIG. 2C, an intermediate voltage detecting section IVD is the same as that of FIG. 2B, and the subtractor 7 and the low-pass filter 8 of FIG. 2B are replaced with a control section CONT constituted by an integrating operational amplifier 7d including an operational amplifier 7b and an integrating capacitor 7c. In addition, a level shifter 1 of FIG. 2C includes the two differential amplifiers 1a and 1b as the adder 2 of FIG. 2A. Each of the differential amplifiers 1a and 1b has a gain of 1.

An operation of a waveform shaping circuit having the above arrangement will be described below.

It is assumed that a center value (intermediate value) between the maximum and minimum values of a digital signal input to the level shifter 1 at time $t_0$ in FIG. 3(a) is equal to the threshold value voltage Vr of the comparator 6. In this case, since an output from the subtractor 7 becomes 0, the digital signal input to the level shifter 1 is directly input to the comparator 6 and compared with the threshold value voltage Vr, thereby performing a waveform shaping operation.

Figure 3:
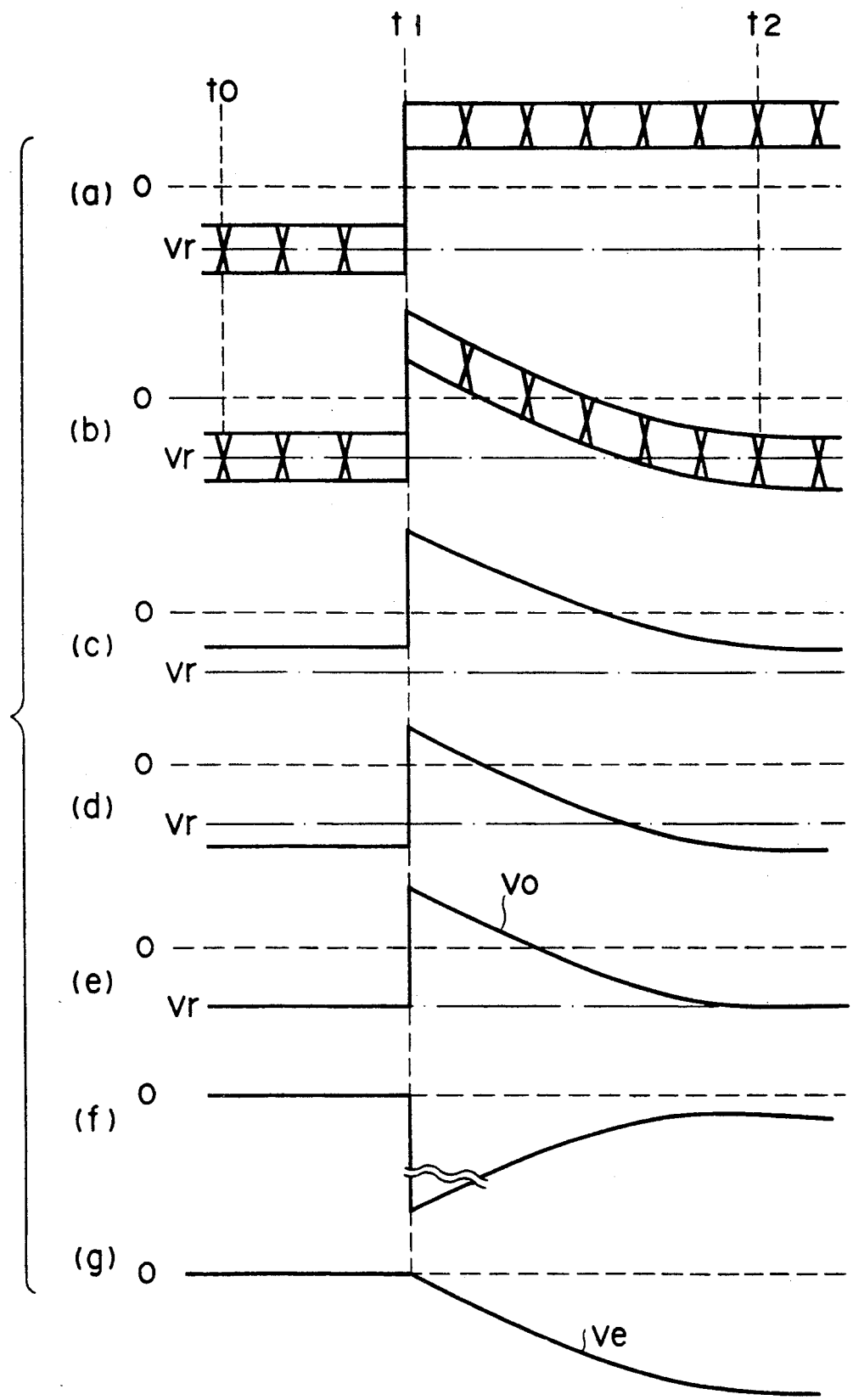
FIG. 3 is a timing chart for explaining an operation of the first embodiment.

At time $t_1$, as shown in (a) of FIG. 3, it is assumed that a DC offset voltage of the digital signal input to the level shifter 1 is increased stepwise. As shown in (b) of FIG. 3, the output signal from the level shifter 1 is increased, and, as shown in (c) and (d) of FIG. 3, the output voltages of the maximum value detector 3 and the minimum value detector 4 are changed stepwise.

For this reason, as shown in (e) of FIG. 3, the center voltage (intermediate voltage) $V_0$ input to the subtractor 7 is changed stepwise, and the output from the subtractor 7 is changed in a negative direction as shown in (f) of FIG. 3.

Therefore, since the subtracted output is integrated, an error signal Ve supplied from the subtractor 7 to the level shifter 1 through the low-pass filter 8, as shown in (g) of FIG. 3, is gradually decreased. For this reason, since a shift amount of the level shifter is gradually increased in the negative direction, the digital signal input to the comparator 6 through the level shifter 1 is changed such that the intermediate value of the digital signal becomes equal to the threshold value Vr, as shown in (b) of FIG. 3.

As a result, at time $t_2$, a difference between the input voltage to the subtractor 7 and the threshold value Vr becomes almost 0. Subsequently, this stable state is continued, and the digital signal having a reliably shaped waveform is obtained from the output terminal of the comparator 6.

In this embodiment, a loop for controlling the shift amount of the level shifter 1 is always closed. However, the loop need not always be closed. For example, as shown in FIG. 4, a holding circuit 10 for receiving a hold signal (stop signal) and holding the magnitude of the error signal and switches 11 and 12 (detector stop means) turned on by the hold signal (stop signal) to apply reverse-biasing voltages V(+) and V(−) to the maximum value detector 3 and the minimum value detector 4 are arranged. In the arrangement in FIG. 4, after the loop is set in an equilibrium state and the shift amount of the level shifter 1 becomes an appropriate amount with respect to a digital signal input to the level shifter 1, the hold signal (stop signal) is input. Subsequently, the shift amount of the level shifter 1 is fixed to an optimal amount, and the detecting operations of the detectors 3 and 4 are stopped so as to substantially open the control loop. As a result, degradation of high-frequency characteristics easily caused by always setting the detectors 3 and 4 in an operating state can be prevented.

Figure 5B:
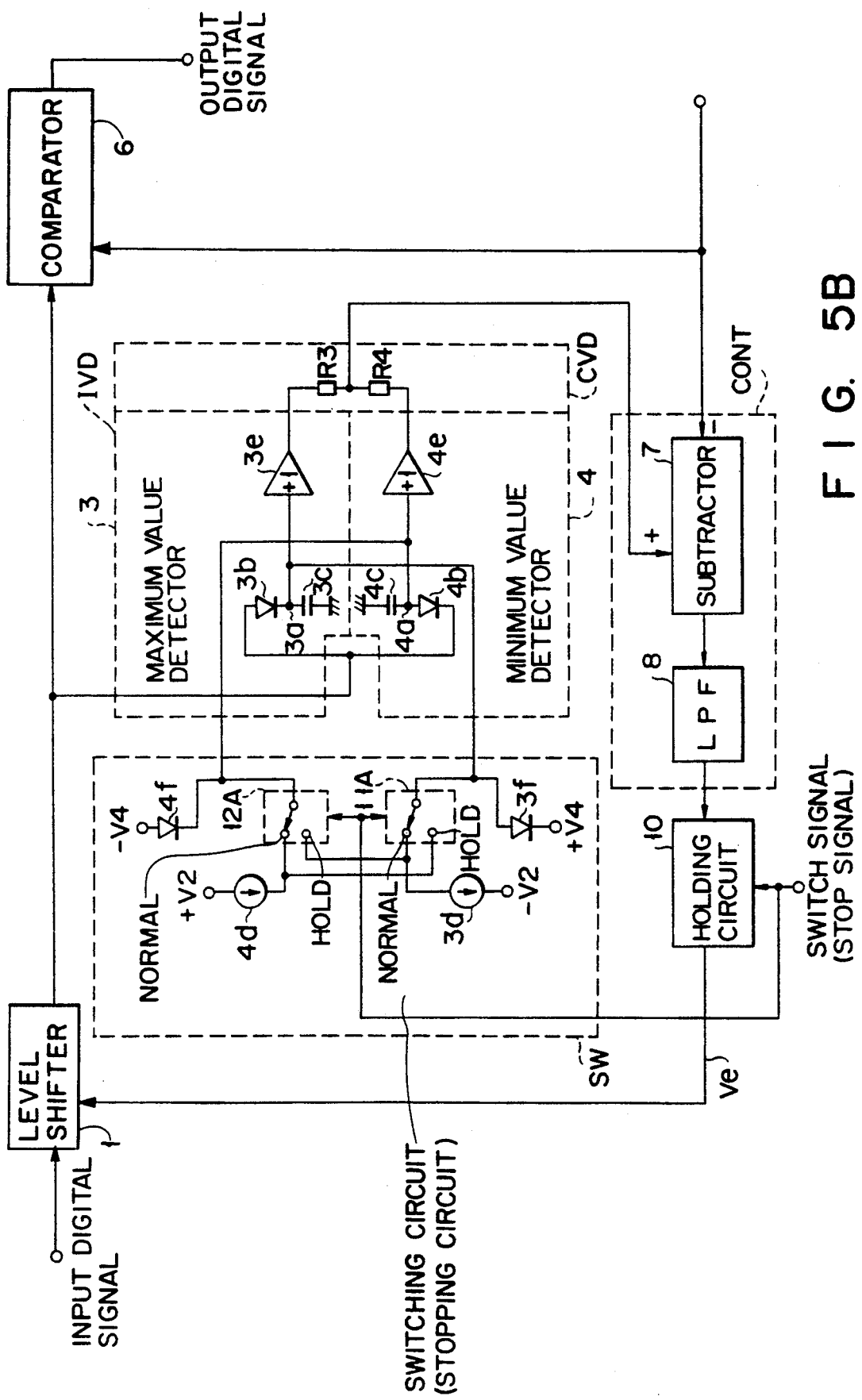
Figure 5C:
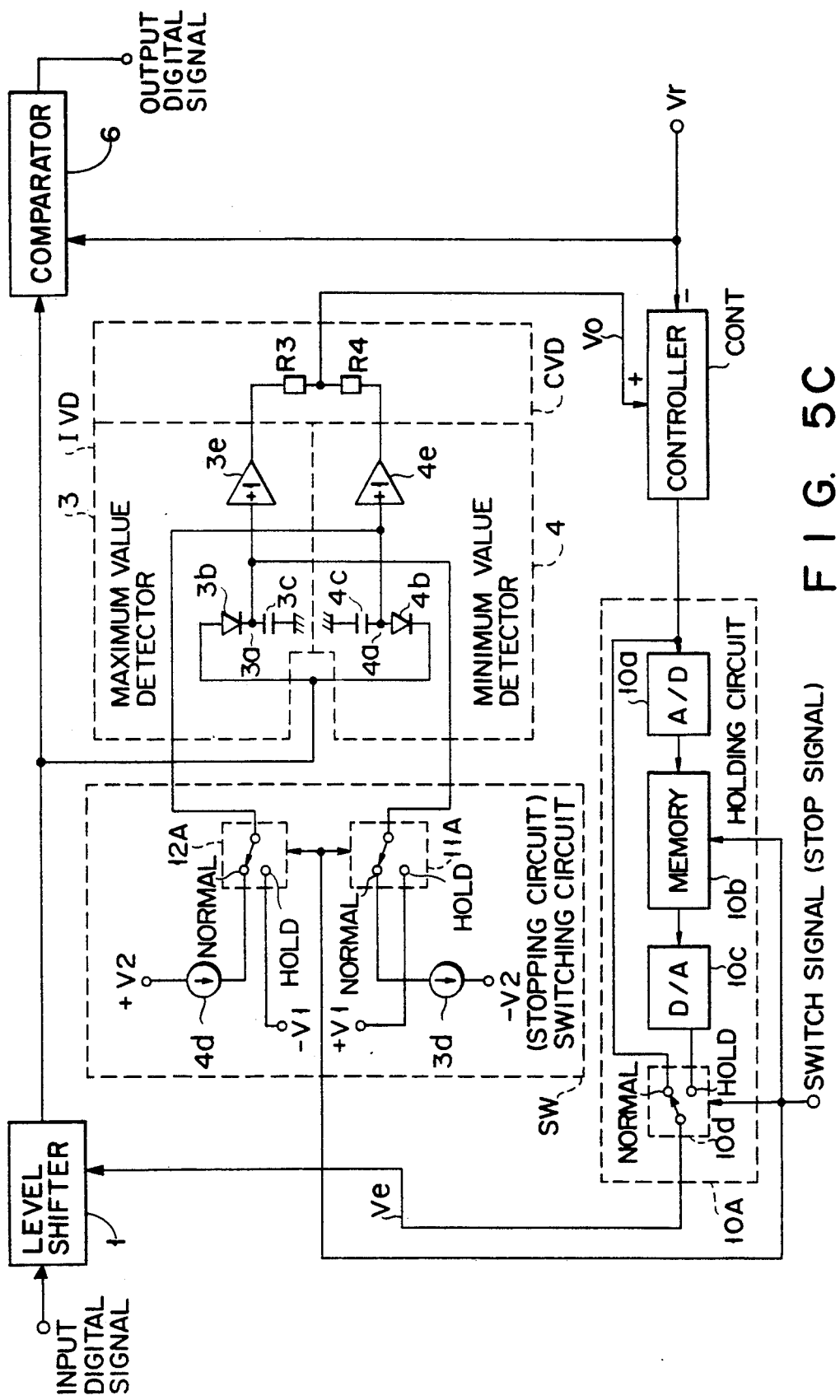

As shown in FIGS. 5A, 5B and 5C when the reversebiasing voltages V(+) and V(−) are selectively set to predetermined voltages, the detectors 3 and 4 can be advantageously used a limiter circuits for protecting the input to the comparator 6. In this modification, a limiter diode which may degrade high-frequency characteristics need not be additionally arranged.

The same reference numerals as in FIGS. 1, 2A, 2B, 2C and 4 denote the same parts in FIG. 5A, and a description thereof will be omitted. In FIG. 5A, a switching circuit SW is additionally arranged.

The switching circuit SW includes interlocked switches 11A and 12A for performing a switching operation between an normal mode (NORMAL) and a hold-/limiter mode (HOLD/LIMITER) in response to a switch signal.

In the normal mode (NORMAL), the diodes 3b and 4b receive the above small forward-biasing currents from positive and negative power sources +V2 and −V2 to detect maximum and minimum values, respectively.

In the hold mode (HOLD), since voltages (e.g., ±V1 = ±4 V) sufficiently larger than the maximum and minimum values of the input digital signal are set as positive and negative power sources +V1 and −V1, the diodes 3b and 4b are reversely biased, and the detecting operations of the maximum and minimum values are stopped as described above.

In the limiter mode (LIMITER), since voltages (e.g., ±V1 = ±1.3 V) each including a prospective forward-biasing voltage drop of 0.7 V in the diodes 3b and 4b are set as the positive and negative power sources +V1 and −V1, the input digital signals can be limited to voltages of ±2 V by the diodes 3b and 4b.

As described above, since the voltages set as the positive and negative power sources +V1 and −V1 are controlled to predetermined voltages of ±V1 = ±4 V or ±V1 = ±1.3 V in accordance with conditions, the hold mode or the limiter mode can be selectively used together with the above normal mode.

In FIG. 5A, reference symbols 3e and 4e denote buffer amplifiers.

FIG. 5B is view showing a case wherein the diodes 3b and 4b are operated as limiters in normal and hold modes.

In FIG. 5B, as in FIG. 5A, forward-biasing voltages are applied to the diodes 3b and 4b by the power source +V2 and −V2 in the normal mode (NORMAL) to detect the maximum and minimum values of the input digital signal.

In the normal mode, when an output voltage from the level shifter 1 becomes lower than a voltage of −2 V (−V4−1.4 V), a current flows through the diode 4b and a diode 4f which is newly arranged, and the limiter is operated at a voltage of −2 V.

In the normal mode, when the output voltage from the level shifter 1 becomes higher than a voltage of (−V4−1.4 V), a current flows through the diode 3b and a diode 3f which is newly arranged, and the limiter is operated at a voltage of −2 V.

In the above cases, the voltage −1.4 V is a voltage drop of the diodes 4b and 4f, and +1.4 is a voltage drop of the diodes 3b and 3f.

In FIG. 5B. as in FIG. 5A in the hold mode (HOLD). reverse-biasing voltages are applied to the diodes 3b and 4b by positive and negative power sources +V2 and −V2 to stop detecting operations of the maximum and minimum values of the input digital signal.

In the hold mode, since voltages (e.g., ±V2=±1.3 V) each including a prospective forwardbiasing voltage drop of 0.7 V in the diodes 3b and 4b are set as the positive and negative power source +V2 and −V2, when the output voltage from the level shifter 1 becomes lower than −2 V or higher than +2 V, as in the above normal mode, the limiter is operated at a voltage of −2 V or +2 V.

In FIG. 5C, an A/D converter 10a, a memory 10b, a D/A converter 10c, and a switch 10d interlocked with the switches 11A and 12A are arranged in the holding circuit 10 shown in FIG. 5A such that digital holding is performed in consideration of stability for several hours or more in the hold mode (HOLD).

In the above embodiment, if the shift amount of the level shifter 1 needs to be known, the shift amount of the level shifter 1 can be known as follows. The magnitude of the error signal Ve is measured by a voltmeter, or a difference between average DC voltages of the input and output of the level shifter 1 detected by an integrator constituted by a resistor $R_5$ and a capacitor $C_5$ as in FIG. 6 is measured by a voltmeter 15. In addition, the threshold level of the input digital signal can be known by this shift amount.

Furthermore, in the embodiment as shown in FIG. 5C, since the shift amount of the level shifter 1 can be detected by the A/D converter 10a, the circuit as shown in FIG. 6 can be omitted.

The waveform shaping circuit used for a very high frequency is described in the above embodiment. However, the waveform shaping circuit can be used for low frequencies.

Not only the comparator constituted by the gallium arsenide FET but a comparator constituted by a silicon bipolar transistor or hetero bipolar transistor (HBT) can be used in the above embodiment. In addition to the level shifter having the above arrangement, a level shifter such as a level shifter constituted by a DC current blocking capacitor and a high frequency blocking coil can be used.

In the waveform shaping circuit for a digital signal according to the first embodiment of the present invention, since the shift amount of the level shifter is automatically controlled such that the DC offset voltage of the input digital signal, i.e., the center value between the maximum and minimum values of the output signal from the level shifter is close to a predetermined threshold value, an amplitude center value of the digital signal input to the comparator is alway equal to the predetermined threshold value without cumbersome manual adjustment, and a waveform shaping operation can be reliably performed.

In a waveform shaping circuit including a holding circuit for holding the magnitude of an error signal with respect to a level shifter and a detector stopping means for stopping the operations of a maximum value detector and a minimum value detector, an shift amount can be fixed to an appropriate value, thereby advantageously preventing the degradation of the high-frequency characteristics of a signal path.

The second embodiment of the present invention using the waveform shaping circuit of the first embodiment will be described below with reference to the accompanying drawings.

Figure 7:
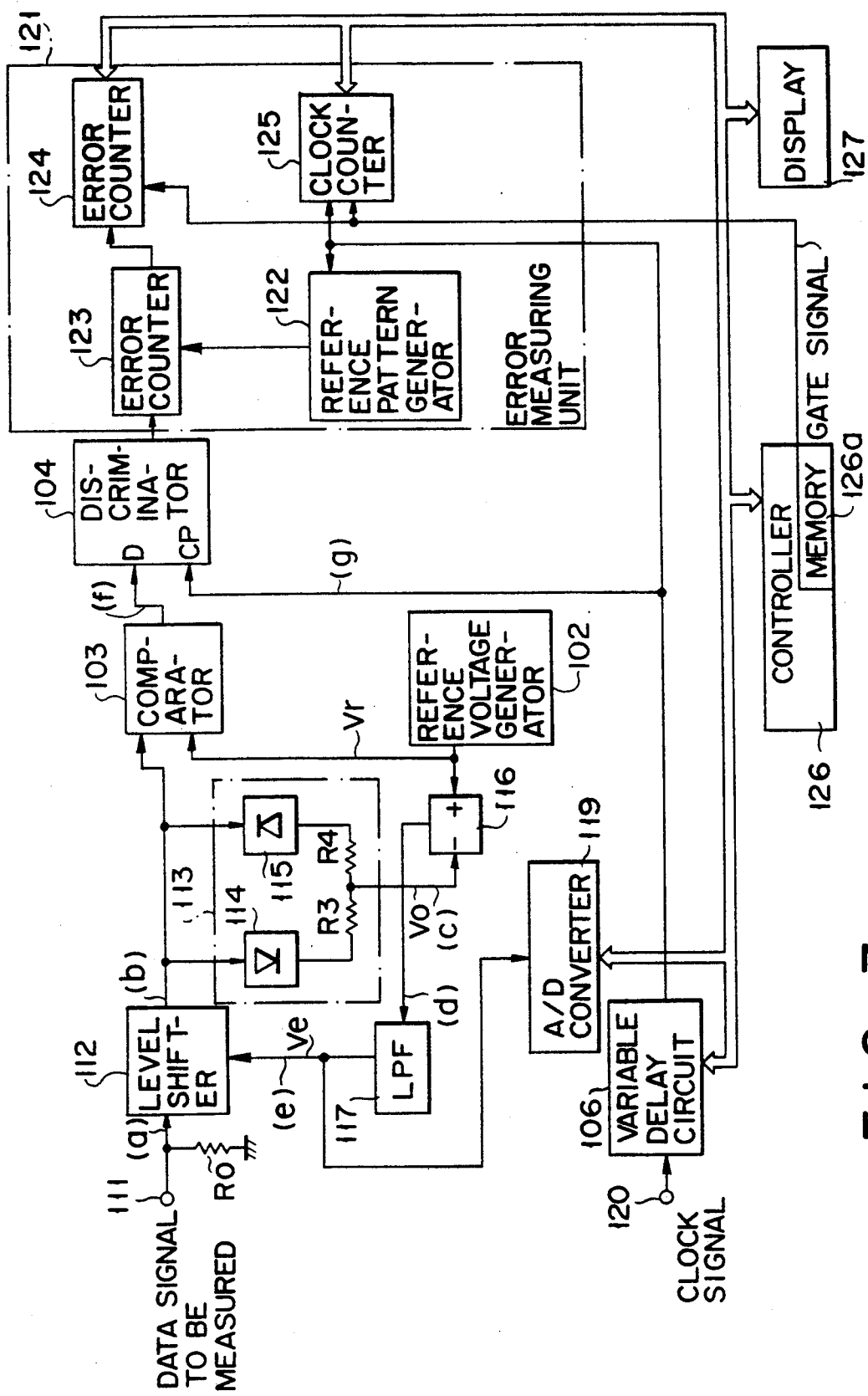
FIG. 7 is a block diagram showing an arrangement of the second embodiment of the present invention.

FIG. 7 is a block diagram showing an arrangement in which a digital signal analyzing device according to the second embodiment is applied to an error measuring unit.

Figure 8A:
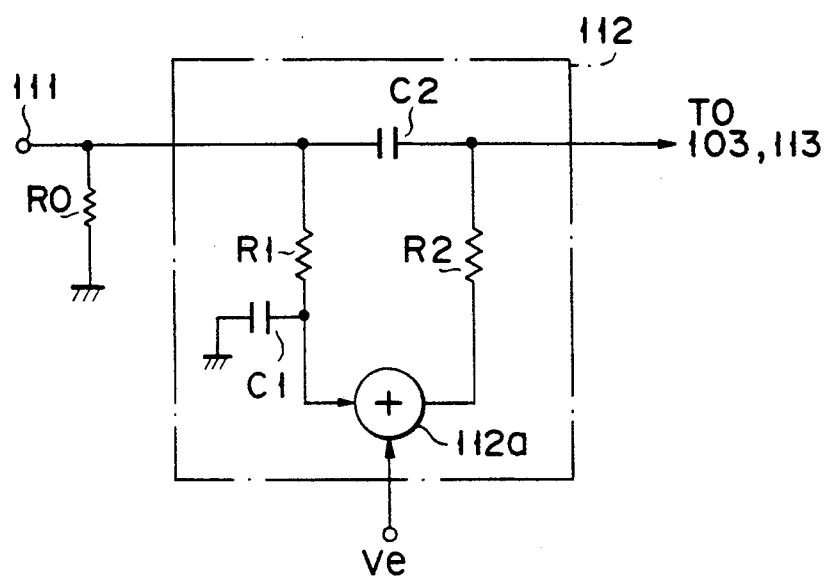
FIGS. 8A and 8B are a circuit diagram and a perspective view, respectively, showing an arrangement of a main part of the second embodiment.

In FIG. 7, a level shifter 112 changes the Dc average (offset) voltage of a data signal to be measured in accordance with the magnitude of an error signal Ve (to be described later). The data signal is input from an input terminal 111 and pulled down to an input resitor $R_0$ (e.g., 50 Ω). As in FIG. 2A, as shown in FIG. 8A, the level shifter 112 is constituted as follows. An adder 112a adds an error signal to the average voltage of the data signal to be measured detected by an integrator constituted by a resistor $R_1$ and a capacitor $C_1$, and the added voltage is added to the data signal to be measured through a resistor $R_2$. In this case, the DC component of the data signal to be measured is blocked by a capacitor $C_2$.

Note that each of the resistors $R_1$ and $R_2$ has a high resistance of about several tens kΩ, which does not influence a transmission of 50Ω.

In an intermediate voltage detector circuit 113 shown in FIG. 7, a high- (H) level peak detector 114 and a low- (L) level peak detector 115 detect the high- (H) and low- (L) level peak voltages of a signal output from the level shifter 112, and an intermediate voltage $V_0$ between the peak voltages is output from a connection point between the two resistors $R_3$ and $R_4$ having the same resistance.

An output signal from the level shifter 112 and a reference voltage Vr from a reference voltage generator 102 are input to a comparator 103.

Reference numeral 116 denotes a subtractor for detecting a different between the reference voltage Vr and the intermediate voltage $V_0$, and reference numeral 117 denotes a low-pass filter (to be referred to as an LPF hereinafter) for integrating the subtracted output from the subtractor 116 to output an error signal to the level shifter 112.

The above arrangement is the same as that of the waveform shaping circuit of the first embodiment, and the detailed arrangements in the first embodiment and the modification apply herein.

Reference numeral 119 denotes an A/D converter for converting an output form the LPF 117, i.e., a shift amount of the level shifter 112, into a digital value.

An clock signal input to an input terminal 120 is input to a discriminator 104 and an error measuring unit 121 through a variable delay circuit 106 (to be described later).

The error measuring unit 121 serving asw a data analyzer of the error measuring apparatus of this embodiment is arranged as follows. That is, a error detector 123 determines whether an output from a discriminator 104 is equal to reference data (having the same pattern as that of data to be measured) output from a reference pattern generator 122 in response to a clock signal output from a variable delay circuit 106, the number of noncoincidence signals output from the comparator 123 is counted by a error counter 124, and the number of clock signals is counted by the clock counter 125.

A controller 126 of the error measuring apparatus is constituted by a microprocessor (CPU) or the like for performing a conventional measuring process and an optimal delay amount detecting process. In the conventional measuring process, the error counter 124 and the clock counter 125 are simultaneously operated for a predetermined time by a gate signal, the CPU reads the counter values to calculate a digital error rate, and the obtained result is displayed on a display 127. In the optimal delay amount detecting process, error rate data with respect to a delay amount obtained by continuously changing a delay amount with respect to the clock signal of the variable delay circuit 106 within a predetermined range is stored in a memory 126a, and a delay amount for obtaining a minimum error rate is detected.

Figure 8B:
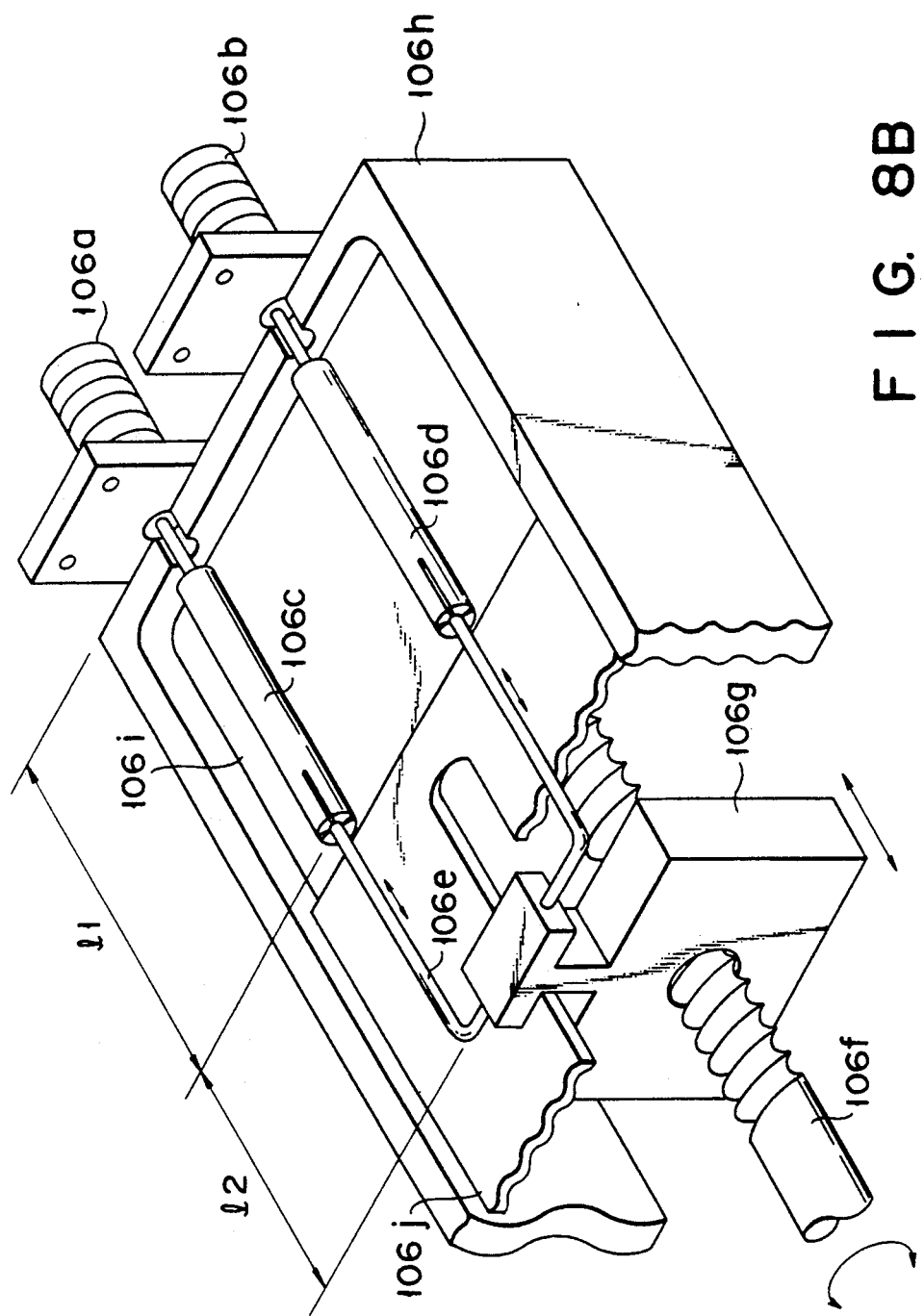

FIG. 8B shows a detailed arrangement of the above variable delay circuit 106. The delay circuit has a variable-length slub line structure. That is, the ends of a U-shaped small-diameter center line 106e are inserted/drawn into/from two parallel large-diameter lines 106c and 106d respectively connected to an input terminal 106a and an output terminal 106d, thereby changing the total line length.

The delay amount of the variable delay circuit 106 is determined by a substantial line length $2l_1 + 2l_2$ between the input terminal 106a and the output terminal 106d. That is, a slidable table 106g is driven by rotating a rotatable screw 106f by a manual operation or a motor means, e.g., a servo motor, thereby changint the line length $l_2$ of the small-diameter center line 106e.

In FIG. 8B, reference numeral 106h denotes a case and reference numerals 106i and 106j denote ground plates serving as external lines and arranged to have different heights such that predetermined characteristics impedances between the center lines 106C, 106d, and 106e in the case 106h are maintained. Note that a cover for the case 106h is omitted in FIG. 8B.

An operation of the error measuring apparatus will be described below.

Figure 9:
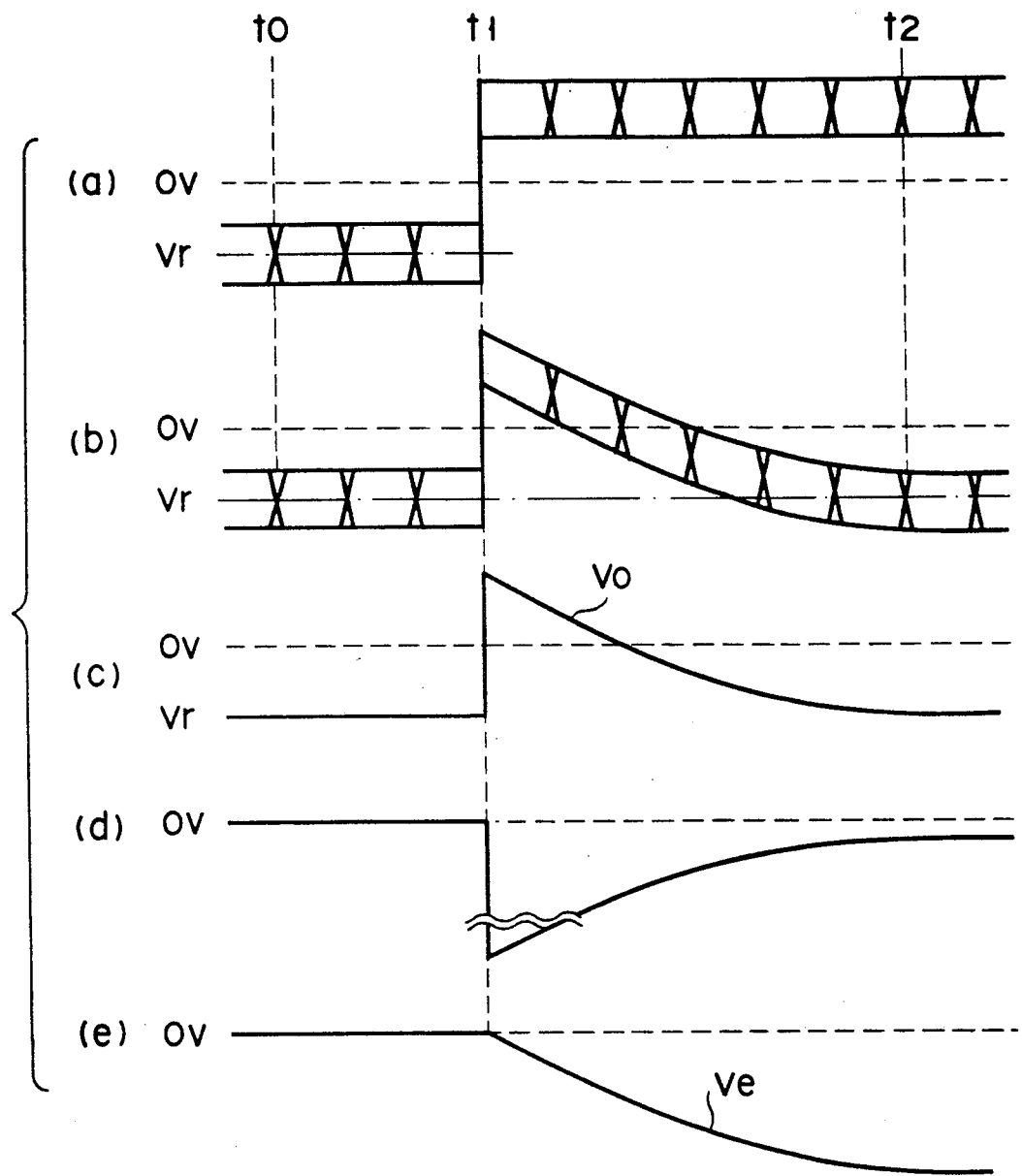
FIG. 9 iss a timing chart for explaining an operation of the second embodiment.

It is assumed that a data signal to be measured having the center value between a high- (H) level peak voltage and a low- (L) level peak voltage equal to the reference voltage Vr of the comparator 103 is input to the level shifter 112 at time $t_0$ as shown in (a) of FIG. 9. In this case, since an output from the subtractor 116 becomes zero, the data signal to be measured input to the level shifter 112 is directly input to the comparator 103 and compared with the reference voltage Vr, thereby performing a waveform shaping operation in optimal conditions.

At time $t_1$, as shown in (a) of FIG. 9, when the offset voltage of the data signal to be measured input to the level shifter 112 is increased stepwise, since an output signal from the level shifter 112 is changed upward stepwise as in (b) of FIG. 9, a center voltage $V_0$ to the subtractor 116 is changed stepwise as in (c) of FIG. 9. As a result, as shown in (d) of FIG. 9, the subtracted output is changed ina negative direction.

The error signal Ve with respect to the level shifter 112, as shown in (e) of FIG. 9, is gradually increased by an output obtained by integrating the subtracted output. The data signal to be measured input to the comparator 103, as shown in (b) of FIG. 9, is changed such that its center value is close to the reference voltage Vr.

As a result, at time $t_2$, a difference between the input voltage of the subtractor 116 and the reference voltage Vr becomes almost zero. Subsequently, the stable state is continued, and a binary digital signal which is waveform-shaped in optimal conditions is output from the comparator to the discriminator 104.

The controller 126 calculates a period T of the clock signal from a gate time of the error measuring unit 121 and the counter value of the clock counter 125, and error rate is calculated every predetermined step d while the delay amount of the variable delay circuit 106 is changed form an initial value $D_0$ in the predetermined step d by at least one period of the clock signal. The resultant values are stored in the memory 126a.

Figure 10:
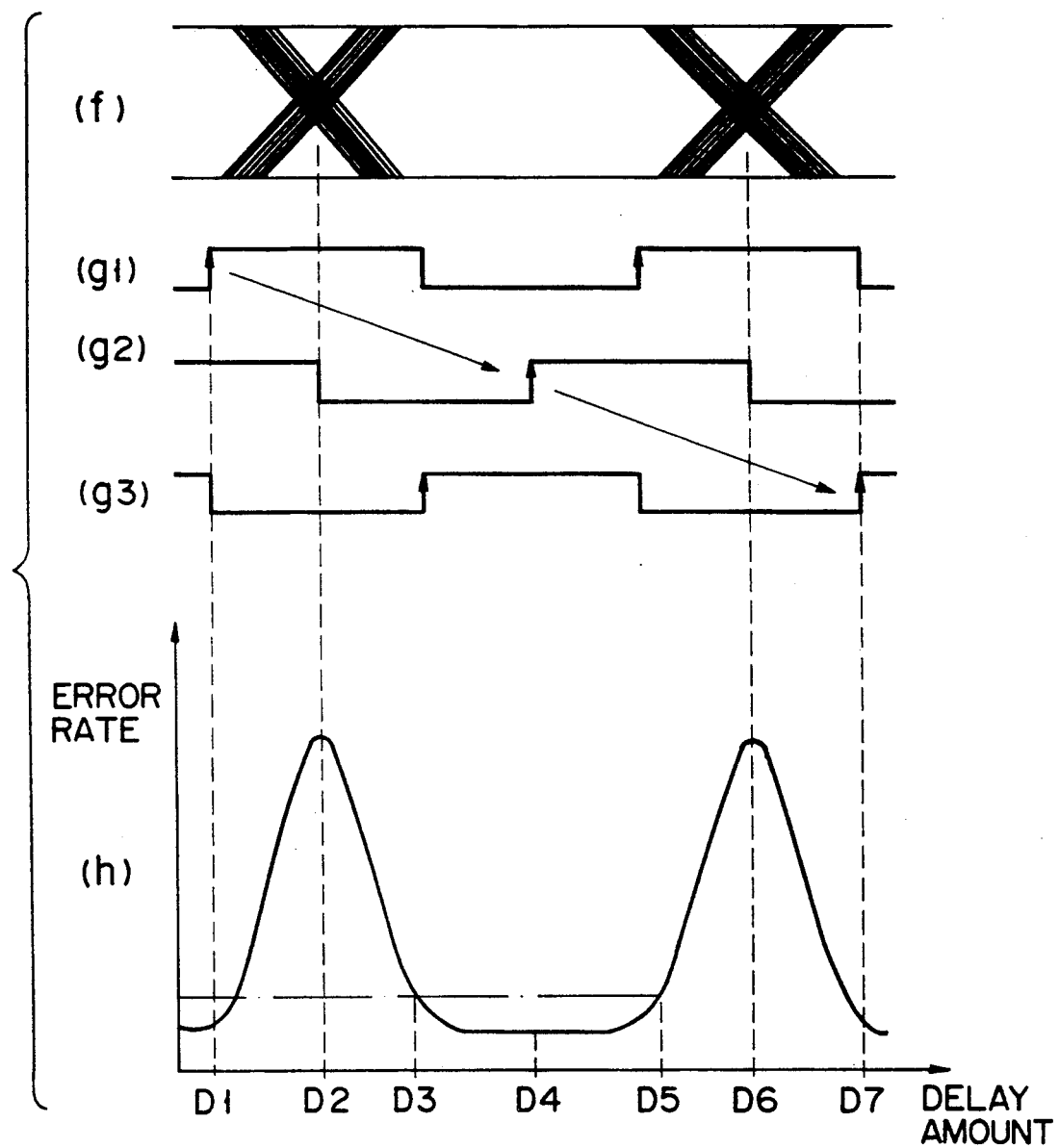
FIGS. 10 is a graph for explaining the operation of the second embodiment.

FIG. 10 is a graph showing a change in error rate with respect to the change in delay amount.

As shown in (g1) to g3) of FIG. 10, when a rise timing of the clock signal is changed by almost 1.5 periods of the clock signal with respect to the output ((f) of FIG. 10) from the comparator 103, a change in error rate is maximum at transition points of the output from the comparator 103 as shown in (h) in FIG. 10. This measurement data is stored in the memory 126a of the controller 126, and an intermediate value $D_4$ between delay amounts $D_2$ and $D_6$ is automatically set in the variable delay circuit 106 as an optimal delay amount having a maximum phase margin.

After the above setting is performed, the controller 126 performs a normal error measuring process to cause the measured error rates to be sequentially displayed on the display 127.

A level shift amount from the A/D converter 119 and the threshold level of the data signal to be measured calculated by the level shift amount and the reference voltage Vr of the comparator 103 are displayed on the display 127 at any time.

Figure 11:
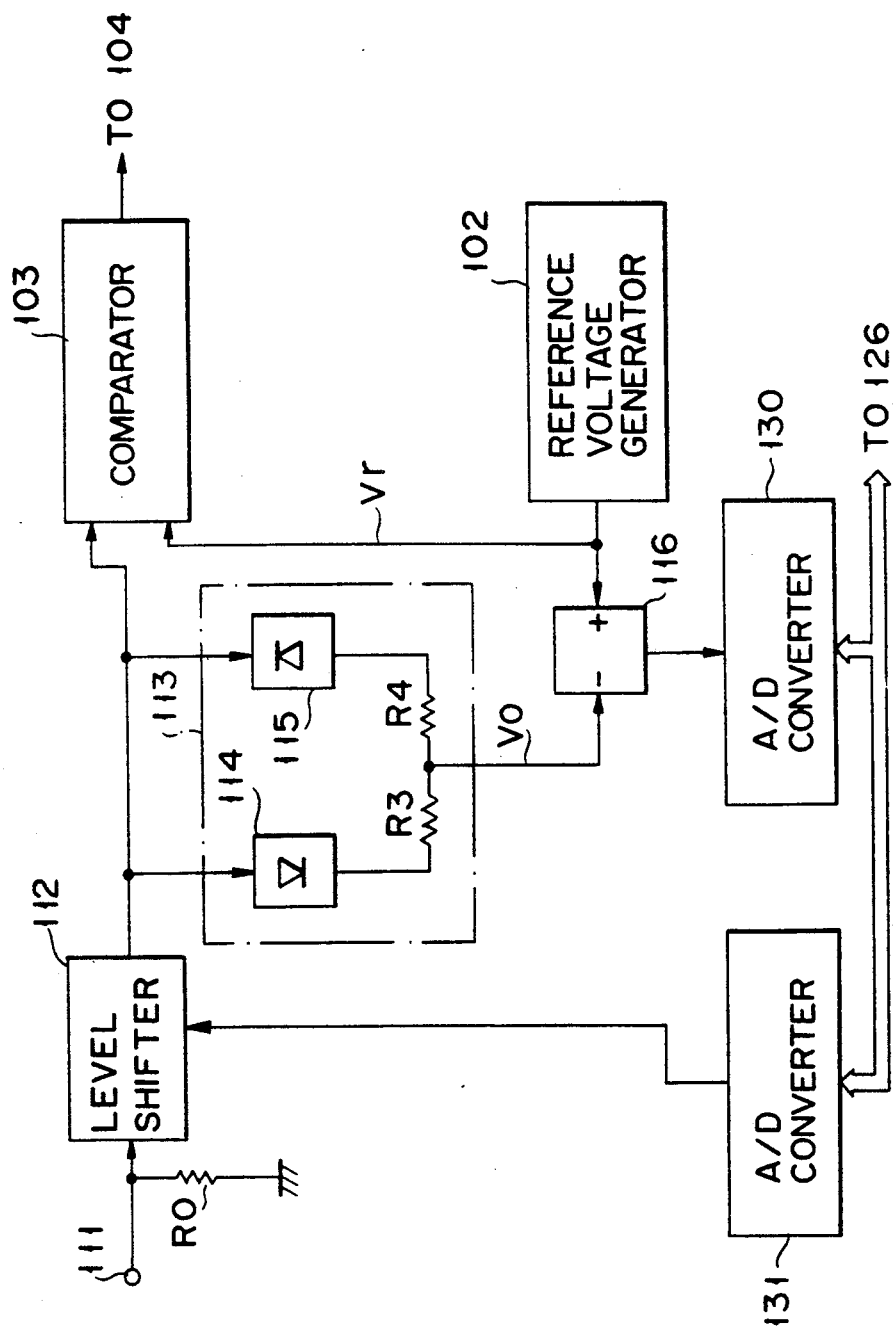
FIG. 11 is a block diagram showing main parts of modifications of the second embodiment of the present invention.

In the above embodiment, although the subtracted value between the intermediate voltage and the reference voltage is input to the level shifter 112 through the LPF 117, the following arrangement may also be used. That is, as shown in FIG. 11, the subtracted value is changed into subtracted digital data by an A/D converter 130, and shift data used for setting the subtracted data to come close to zero is sent from the cotnroller 126 to a D/A converter 131, thereby controlling the shift amount of the level shifter 112.

In the above embodiment, in order to set an optimal delay amount with respect to the clock signla, the optimal amount is determined by the maximum value of an error rate obtained by changing a delay amount for one or more periods of the clock signal. However, a delay amount for obtaining the minimum value of the error rate can be directly set as the optimal value. In this case, a plurality of delay amounts for obtaining the minimum value are obtained, and a maximum phase margin may not be obtained.

In the above embodiment, a maximum error rate is used as an optimal delay amount. However, the intermediate value between two delay amounts ($D_3$ and $D_5$ in (f) to (g) of FIG. 10) for obtainign equal error rates can be set as an optimal delay amount.

The following arrangement may be employed by the above embodiment. That is, sequential operations for setting the optimal threshold voltage of the data signal to be measured are started by operating input means such as switches arranged in the display, the operations are finished, and then an operation for setting the optimal delay amount is performed. Thus, the set threshold level and delay amount may be displayed on the display.

Figure 12:
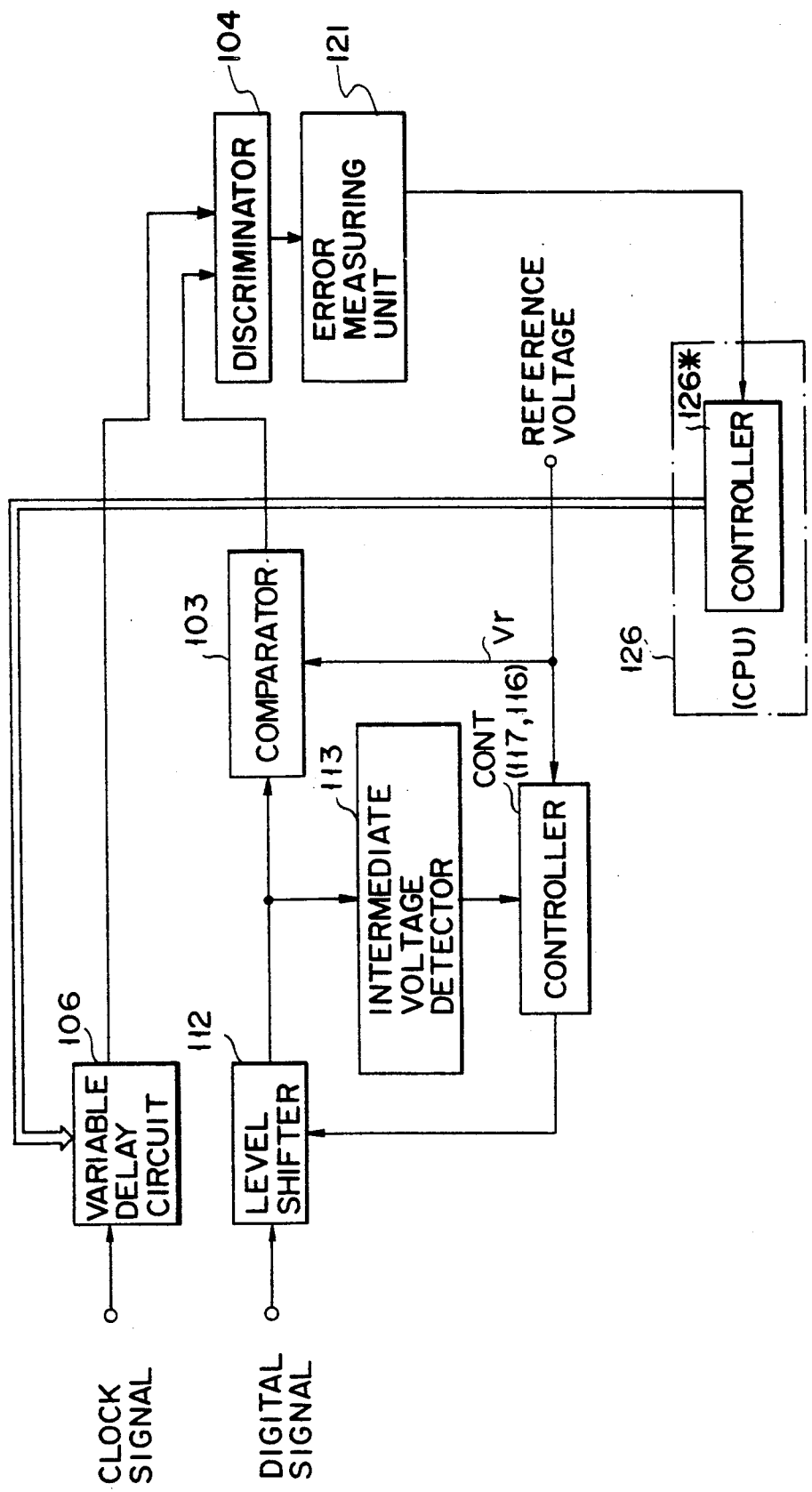

FIG. 12 is a block diagram showing an arrangement of a main part extracted from the digital signal analyzing apparatus shown in FIG. 7 in order to readily understand the second embodiment of the present invention. The same reference numerals as in FIG. 7 denote the same part in FIG. 12.

In the signal analyzing device, basically, a part including the level shifter 112 constituting the waveform shaping circuit described in the first embodiment, the intermediate voltage detector 113, the control section (including a subtractor and an LPF) 116 and 117, and the comparator 103 optimizes the input digital signal in the vertical (amplitude axis) direction, and a part including the variable delay circuit 106, and discriminator 104, the error measuring unit 121, and the control section (including a CPU) 126, including controller 126& optimizes the input digital signal in the horizontal (time axis) direction. Therefore, data analysis can be easily and accurately performed such that the errors (rate) of the input digital signal are measured.

Several modifications of the arrangement in FIG. 12 will be described below.

Figure 13:
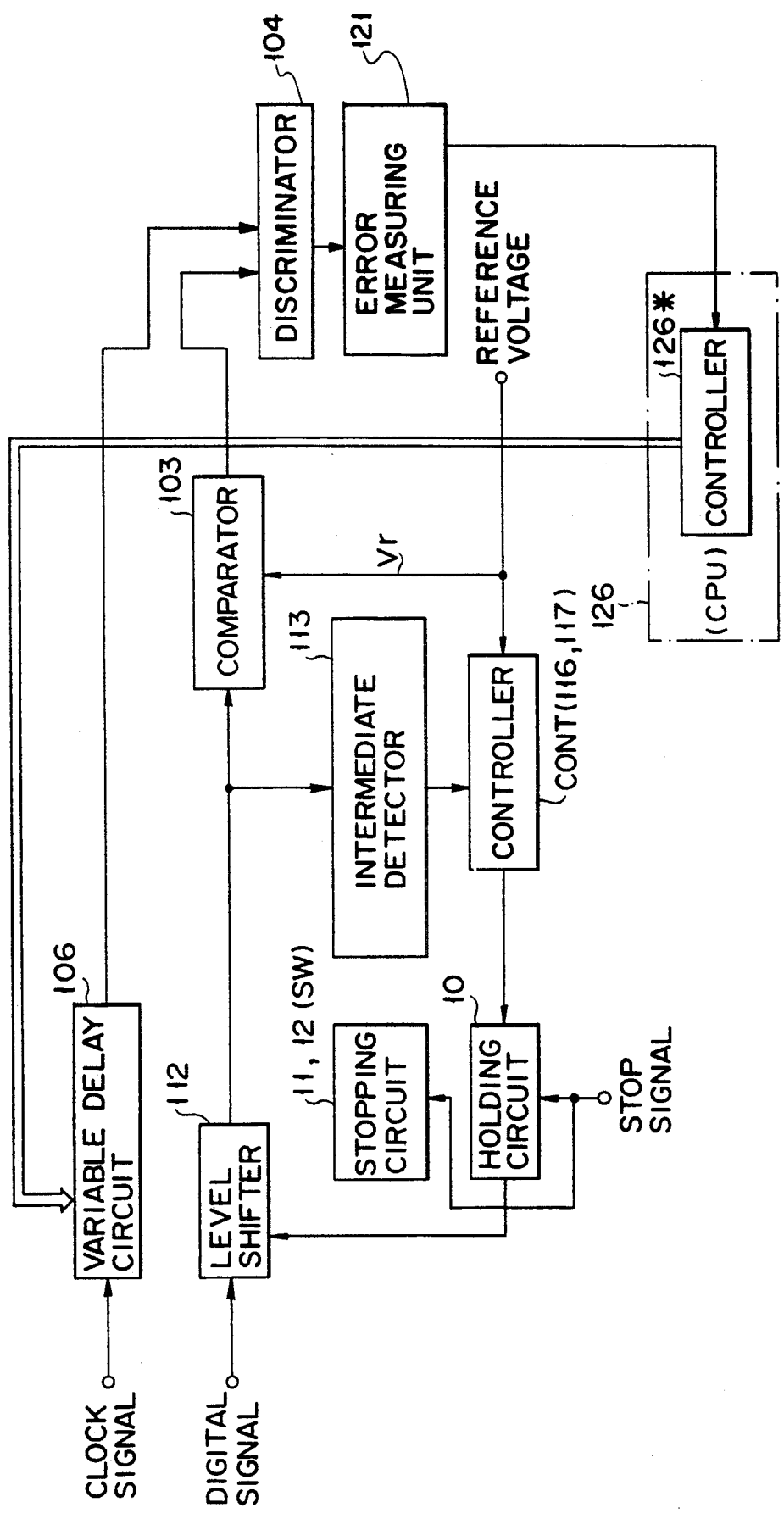

A modification in FIG. 13 is obtained by adding a holding circuit 10 and stopping circuits (switches) 11 and 12 shown in FIG. 4 to the waveform shaping circuit portion in the arrangement of FIG. 12.

A modification in FIG. 14 is obtained by adding the holding circuit 10 and a switching circuit SW shown in FIGS. 5A and 5B to the waveform shaping circuit portion in the arrangement of FIG. 12.

Figure 15:
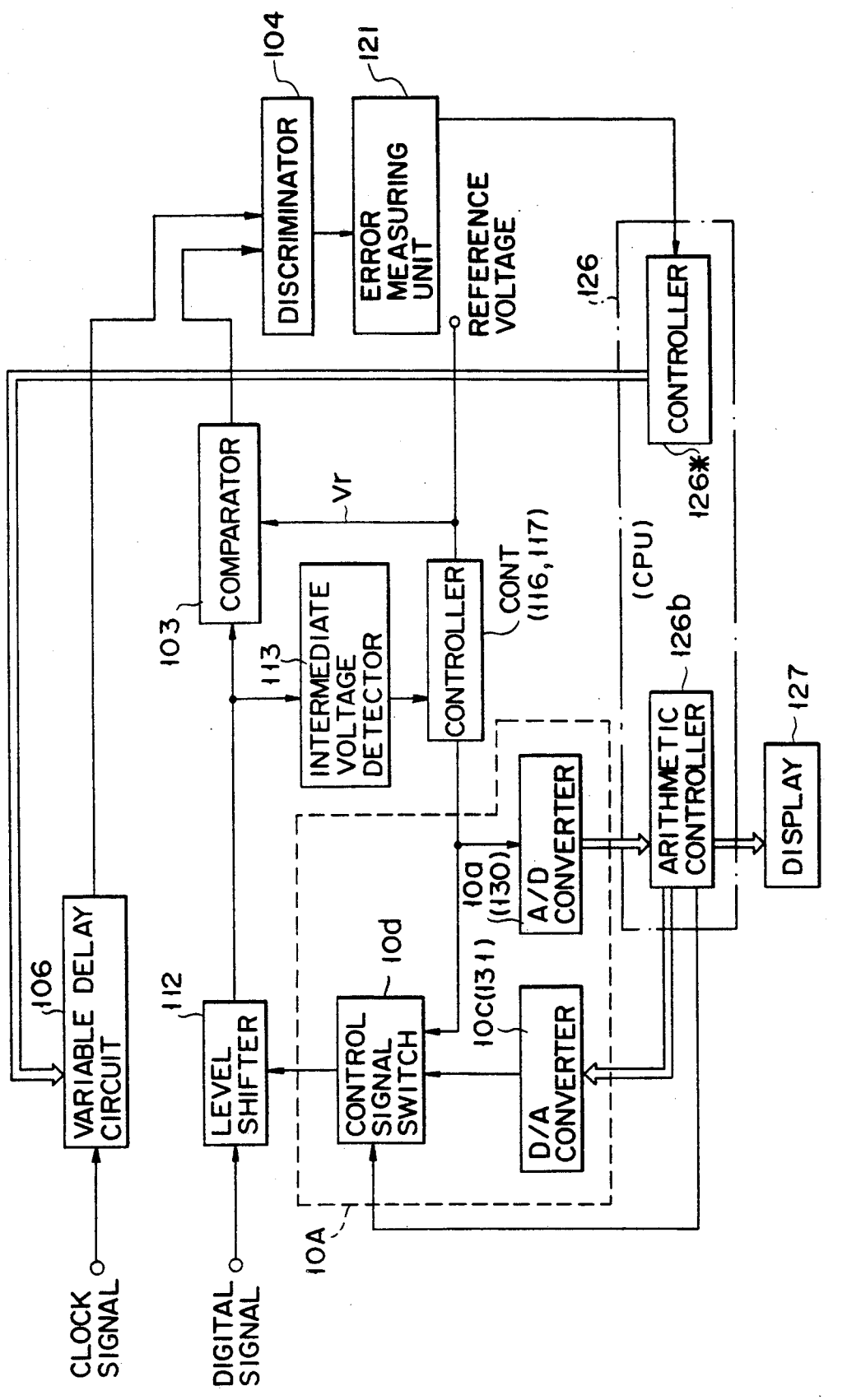

A modification in FIG. 15 is obtained by adding a holding circuit 10A of the first embodiment shown in FIG. 5C to the waveform shaping circuit portion in the arrangement of FIG. 12. In this modification, an A/D converter 10a and a D/A converter 10c correspond to an A/D converter 130 and a D/A converter 131 shown in FIG. 11. An arithmetic controller 126b in the controller (CPU) 126 performs a calculation fo displaying the DC offset voltage of an input digital signal by the display 127 on the basis of data output from the A/D converter 10a, and data corresponding to the data from the A/D converter 10a and desired data are selectively output to the D/A converter 10c.

Since digital analysis may be performed for 10 or more hours, the above digital holdign is advantageously used for ensuring stability during the digital analysis.

In the above modifications, in a state wherein the in-phase of the input clock signal is shown in advance, the variable delay circuit 106 on a clock signal line can be omitted.

A modification in FIG. 16 is obtained by arranging the variable delay circuit 106 to the previous stage of the level shifter 112 on an input digital signal line in the arrangement of FIG. 12. In this modification, similar to the operation of FIG. 12, after the input digital signal is optimized in the vertical (amplitude axis) direction thereof, the input digital signal is optimized in the horizontal (time axis) direction thereof.

FIG. 17 shows a modification obtained by connecting the variable circuit 106 to the sequence stage of the comparator 103 through an input digital signal line in the arrangement of FIG. 12. In this modification, similar to the operation of FIG. 12, after an input digital signal is optimized in the vertical (amplitude axis) direction thereof, the input signal is optimized in the horizontal (time axis) direction.

FIG. 18 shows a modification obtained by applying the same waveform shaping circuit as that of FIG. 13 to the arrangement of FIG. 16.

FIG. 19 shows a modification obtained by applying the same waveform shaping circuit as that of FIG. 13 to the arrangement of FIG. 17.

Figure 20:
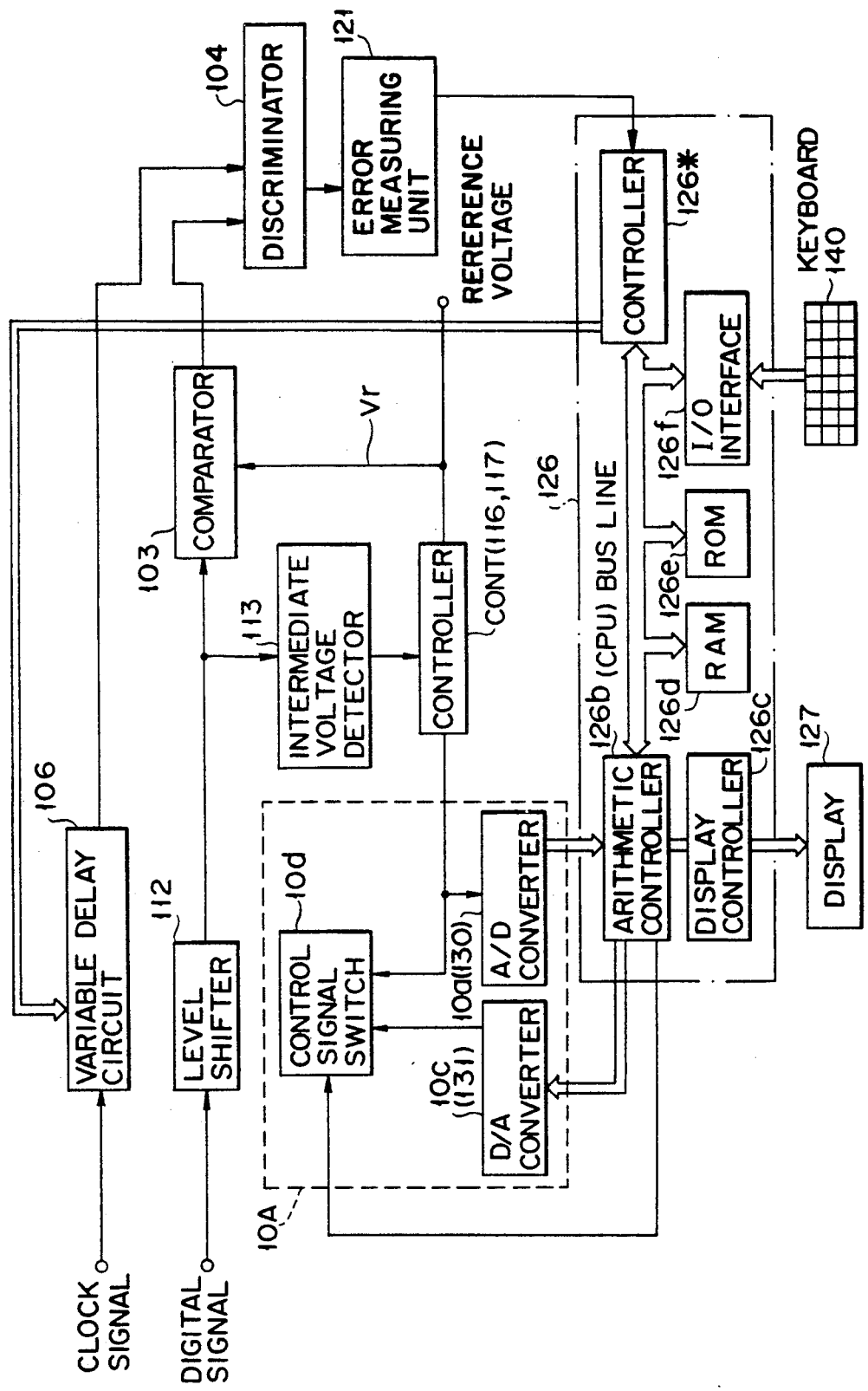

FIG. 20 shows a modification having the following arrangement. That is, in the controller (CPU) 126 in the arrangement of FIG. 15, the controller 126* is connected to the arithmetic controller 126b via a bus line, and a RAM 126d, a ROM 126e, and an I/O interface 126f are connected to the bus line. In this arrangement, all control functions required for the above embodiments can be performed by software under the control of the controller (CPU) 126. In this modification, a display controller 126c is connected between the arithmetic controller 126b and the display 127, and an external keyboard 140 or a communication line is connected to the I/O interface.

Figure 21:
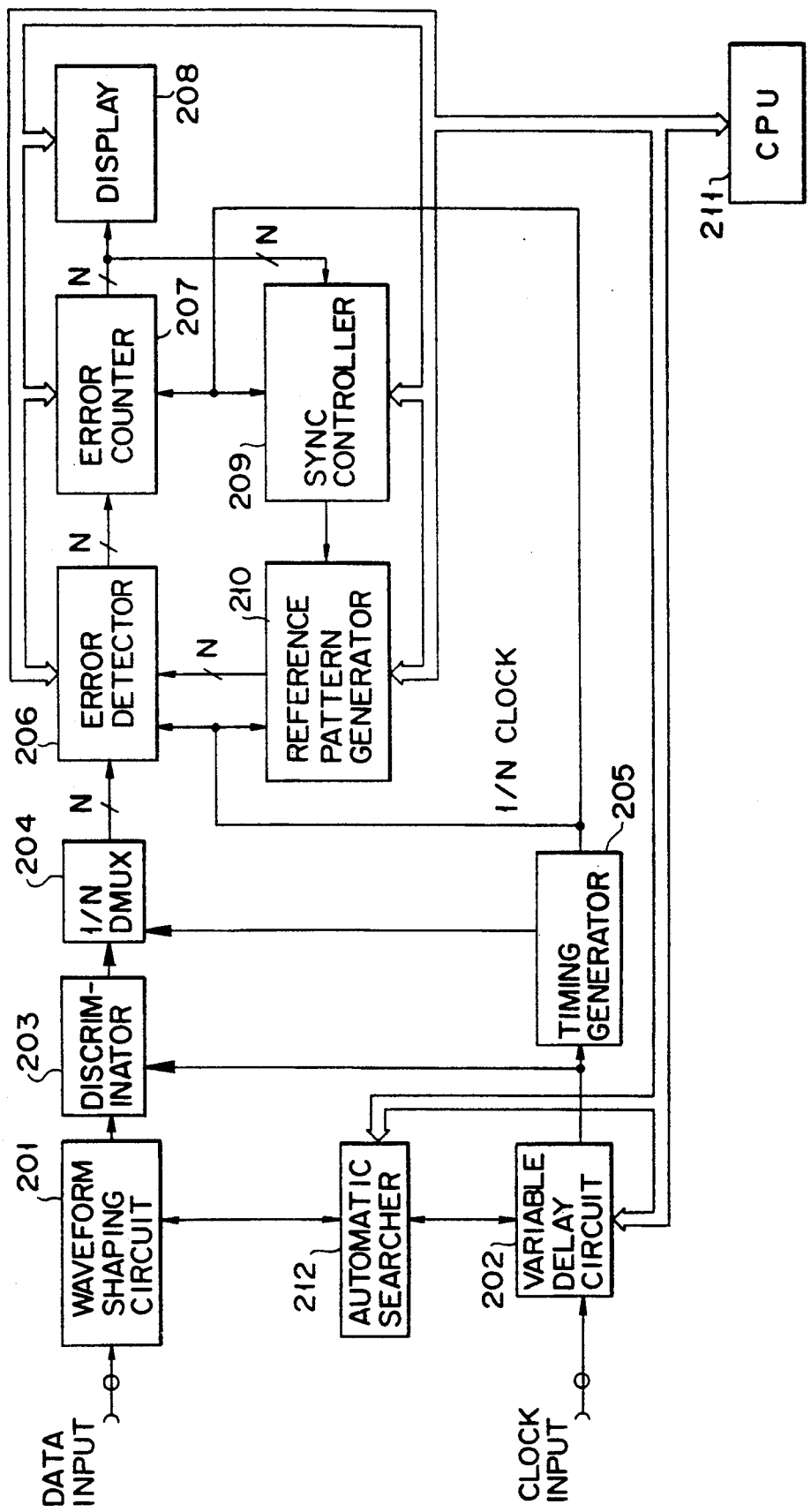
FIG. 21 is a block diagram showing an error measuring unit according to the second embodiment of the present invention.
Figure 22:
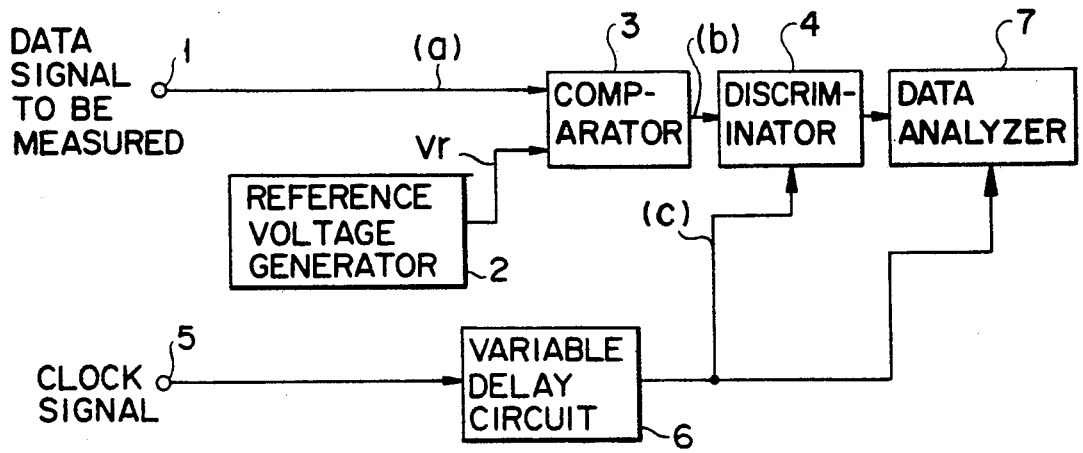
FIG. 22 is a block diagram showing an arrangement of a conventional signal analyzing apparatus.
Figure 23A:
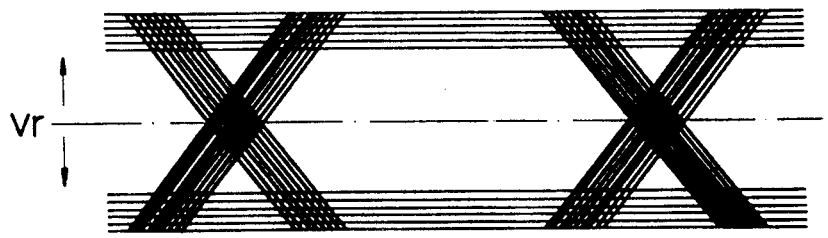
FIGS. 23A, 23B, and 23C are views for explaining an adjusting operation of the conventional signal analyzing apparatus.
Figure 23B:
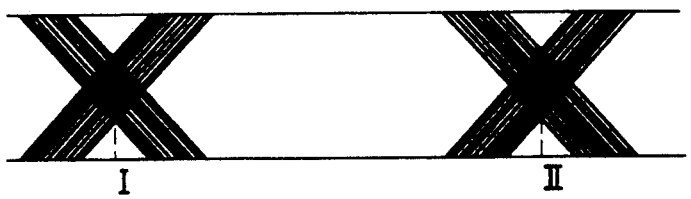
Figure 23C:

FIG. 21 is shows an error measuring apparatus in which the second embodiment of the present invention is employed. Input data supplied to a waveform shaping circuit 201 and an input clock signal supplied to a variable delay circuit 202 are optimized as described above to be output to a disrciminator 203. The data discriminated by the discriminator 203 as described above is 1/N-divided by a 1/N demultiplexer 204 in accordance with a timing signal output in response to an output clock signal of the variable delay circuit 202 from a timing generator 205. When the input date has a frequency of 10 GHz and N=32, the frequency is divided into 310 MHz. In this case, after the input data is error-detected as 32-channel data by an error detector 206, the data is sent to a display 208 and a sync controller 209 through an error counter 207. A reference pattern generator 210 generates reference pattern data supplied to the error detecdtor 206 in accordance with an output from the sync controller 209. The error detector 206, the reference pattern generator 210, the error counter 207, and the sync controller 209 are controlled by the 1/N-divided clock signal from the timing generator 205. A CPU 211 controls the above parts. Note that an automatic searcher 212 controls the waveform shaping circuit 201 and the variable delay circuit 202 under the CPU 211 in an appropriate state.

In the digital signal analyzing apparatus according to the second embodiment of the present invention, as described above, a shift amount of a data signal to be measured is automatically controlled such that the intermediate voltage of a data signal to be measured always serves as the reference voltage of a comparator. In addition, the digital signal analyzing apparatus has a delay amount setting means. In this means, a delay amount required for setting the disrcimination timing of the discriminator at an optimal position between adjacent state transition points of the digital signal input from the comparator to the discriminator is detected on the basis of an alaysis result obtained by changing a delay amount of the variable delay circuit for the clock signal within a predetermined range, and the delay amount is set in the variable delay circuit.

For this reason, although a cumbersome manual adjusting operation is not performed while an waveform is observed, an operating point or a discrimination timing of waveform shaped by a comparator can be optimally and automatically set free from differences among individuals and an error caused by distortion of the waveform.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A waveform shaping circuit comprising:
a level shifter for variably controlling a direct current (DC) offset voltage of an input digital signal;
a comparator for comparing a digital signal output from said level shifter with a predetermined reference voltage so as to shape a waveform of the input digital signal and outputting a shaped digital signal;
intermediate voltage detecting means for detecting and outputting an intermediate voltage between high- and low-level voltages of a digital signal output from said level shifter; and
control means for receiving the intermediate voltage output from said intermediate voltage detecting means and the predetermined reference voltage and outputting a control signal for changing the DC offset voltage to equalize the intermediate voltage to the predetermined reference voltage, to said level shifter.

2. A circuit according to claim 1, further comprising:
holding means for holding the control signal output from said control means; and
stopping means for stopping an operation of said intermediate voltage detecting means when the control signal is held by said holding means.

3. A circuit according to claim 1, further comprising:
holding means for holding the control signal output from said control means; and
switching means for causing said intermediate voltage detecting means to switch from a state for detecting the intermediate voltage between the high- and low-level voltages of the digital signal output from said level shifter to a state for limiting the high- and low-level signals of the digital signal output from said level shifter to not less than the predetermined voltage and not more than the predetermined voltage, respectively, when the control signal is held by said holding means.

4. A waveform shaping circuit comprising:
a level shifter for variably controlling a direct current (DC) off-set voltage of an input digital signal;
a comparator for comparing a digital signal output from said level shifter with a predetermined reference voltage so as to shape a waveform of the input digital signal and outputting a shaped digital signal;
a maximum value detector for detecting a maximum value of a digital signal output from said level shifter;
a minimum value detector for detecting a minimum value of the digital signal output from said level shifter;
center voltage detecting means for detecting a center voltage between the maximum value detected by said maximum value detector and the minimum value detected by said minimum value detector;
a subtractor for detecting a difference voltage between the center voltage output from said center voltage detecting means and the predetermined reference voltage and outputting an error signal obtained by amplifying a detected difference voltage so as to equalize the center voltage to the predetermined reference voltage by changing the DC offset voltage; and
a low-pass filter for selecting a signal component having a frequency lower than a predetermined frequency from the error signal output from said subtractor and outputting a control signal so as to control the DC off-set voltage to said level shifter.

5. A circuit according to claim 4, further comprising:
holding means for holding the control signal output from said low-pass filter; and
stopping means for stopping operations of said maximum value detector and said minimum value detector when the control signal is held by said holding means.

6. A circuit according to claim 4, further comprising:
holding means for holding the control signal output from said low-pass filter; and
switching means for causing said maximum value detector to switch from a state for detecting a maximum value of the digital signal output from said level shifter to a state for limiting the maximum value of the digital signal output from said level shifter to not more than a predetermined value and causing said minimum value detector to switch from a state for detecting a minimum value of the digital signal output from said level shifter to a state for limiting the minimum value of the digital signal output from said level shifter to not less than the predetermined value, when the control signal is held by the said holding means.

7. A signal analyzing apparatus comprising:
a level shifter for variably controlling a direct (DC) off-set voltage of an input digital signal;
a comparator for comparing a digital signal output from said level shifter with a predetermined reference voltage so as to shape a waveform of the input digital signal and outputting a shaped digital signal;
intermediate voltage detecting means for detecting and outputting an intermediate voltage between high- and low-level voltages of a digital signal output from said level shifter;
first control means for receiving the intermediate voltage output from said intermediate voltage detecting means and the predetermined reference voltage and outputting a control signal for changing the DC offset voltage to equalize the intermediate voltage to the predetermined reference voltage to said level shifter;
a variable delay circuit for delaying a phase of an input clock signal;
a discriminator for receiving an output from said comparator and an output from said variable delay circuit and determining a code of the output signal from said comparator at a timing determined by a delayed clock signal delayed by said variable delay circuit;

an error measuring unit for comparing a determination signal from said discriminator with a reference signal corresponding to the input digital signal and outputting an error signal; and second control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

8. An apparatus according to claim 7, further comprising:

holding means for holding the control signal output from said first control means; and stopping means for stopping an operation of said intermediate voltage detecting means when the control signal is held by the holding means.

9. An apparatus according to claim 7, further comprising:

holding means for holding the control signal output from said first control means; and switching means for causing said intermediate voltage detecting means to switch from a state for detecting the intermediate voltage between the high- and low-level voltages of the digital signal output from said level shifter to a state for limiting the high- and low-level signals of the digital signal output from said level shifter to not less than the predetermined voltage and not more than the predetermined voltage, respectively, when the control signal is held by said holding means.

10. An apparatus according to claim 7, further comprising:

an analog to digital (A/D) converter for outputting data corresponding to the control signal output from said first control means;

an arithmetic controller for performing a calculation for displaying the DC offset voltage of the input digital signal in accordance with the data output from said A/D converter so as to output a calculation result to a display and for selectively outputting desired data and data corresponding to the data output from said A/D converter together with a switch control signal;

a digital to analog D/A converter for outputting an analog signal corresponding to the data output from said arithmetic controller; and a control signal switch for selectively outputting the analog signal output from said D/A converter and the control signal output from said first control means to said level shifter in accordance with the switch control signal output from said arithmetic controller.

11. A signal analyzing apparatus comprising:

a level shifter for variably controlling a direct current (DC) offset voltage of an input digital signal;

a comparator for comparing a digital signal output from said level shifter with a predetermined reference voltage so as to shape a waveform of the input digital signal and outputting a shaped digital signal;

intermediate voltage detecting means for detecting and outputting an intermediate voltage between high-and low-level voltages of a digital signal output from said level shifter;

control means for receiving the intermediate voltage output from said intermediate voltage detecting means and the predetermined reference voltage and outputting a control signal for changing the DC offset voltage to equalize the intermediate voltage to the predetermined reference voltage to said level shifter;

a discriminator for receiving an input clock signal and an output from said comparator as a signal to be discriminated to determine a code of the signal to be discriminated at a timing determined by the input clock signal; and an error measuring unit for comparing a determination signal from said discriminator with a reference signal corresponding to the input digital signal, to thereby output an error signal.

12. An apparatus according to claim 11, further comprising:

holding means for holding the control signal output from said control means; and stopping means for stopping an operation of said intermediate voltage detecting means when the control signal is held by said holding means.

13. An apparatus according to claim 11, further comprising:

holding means for holding the control signal output from said control means; and switcing means for causing said intermediate voltage detecting means to switch from a state for detecting the intermediate voltage between the high- and low-level voltages of the digital signal output from said level shifter to a state for limiting the high- and low-level signals of the digital signal output from said level shifter to not less than the predetermined voltage and not more than the predetermined voltage, respectively, when the control signal is held by said holding means.

14. An apparatus according to claim 11, further comprising:

an analog to digital (A/D) converter for outputting data corresponding to the control signal output from said control means;

an arithmetic controller for performing a calculation for displaying the DC offset voltage of the input digital signal in accordance with the data output from said A/D converter so as to output a calculation result to a display and for selectively outputting desired data and data corresponding to the data output from said A/D converter together with a switch control signal;

a digital to analog (D/A) converter for outputting an analog signal corresponding to the data output from said arithmetic controller; and a control signal switch for selectively outputting output from said control means to said level shifter in accordance with the switch control signal output from said arithmetic controller.

15. An apparatus according to claim 11, further comprising:

a variable delay circuit for delaying a phase of the input clock signal and sending a delayed clock signal to said discriminator; and control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

16. An apparatus according to claim 11, further comprising:

a variable delay circuit for delaying a phase of the input digital signal and sending a delayed digital signal to said level shifter; and control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

17. An apparatus according to claim 11, further comprising:

a variable delay circuit for delaying a phase of a signal output from said comparator and sending a delayed signal to said discriminator as a signal to be discriminated; and control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

18. A signal analyzing apparatus comprising:

a level shifter for variably controlling a direct current (DC) offset voltage of an input digital signal;

a comparator for comparing a digital signal output from said level shifter with a predetermined reference voltage so as to shape a waveform of the input digital signal and outputting a shaped digital signal;

intermediate voltage detecting means for detecting and outputting an intermediate voltage between high-and low-level voltages of a digital signal output from said level shifter;

control means for receiving the intermediate voltage output from said intermediate voltage detecting means and the predetermined reference voltage to output a control signal for changing the DC offset voltage to equalize the intermediate voltage to the predetermined reference voltage to said level shifter;

holding means for holding the control signal output from said control means;

stopping means for stopping an operation of said intermediate voltage detecting means when the control signal is held by said holding means;

a discriminator for receiving an input clock signal and an output from said comparator as a signal to be discriminated to determine a code of the signal to be discriminated at a timing determined by the input clock signal; and an error measuring unit for comparing a determination signal from said discriminator with a reference signal corresponding to the input digital signal to output an error signal.

19. An apparatus according to claim 18, further comprising:

a variable delay circuit for delaying a phase of the input clock signal and sending a delayed clock signal to said discriminator; and control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

20. An apparatus according to claim 18, further comprising:

a variable delay circuit for delaying a phase of the input digital signal and sending a delayed digital signal to said level shifter; and control means for receiving an output from said error measuring unit, detecting an intermediate delay amount of delay amounts corresponding to error signals having aximum values adjacent to each other, and sending the intermediate delay amount to said variable delay circuit, to thereby reduce the error signal output from said error measuring unit.

21. An apparatus according to claim 18, further comprising:

a variable delay circuit for delaying a phase of a signal output from said comparator and sending a delayed signal to said discriminator as a signal to be discriminated; and control means for receiving an output from said error measuring unit, detecting an intermediate delay amount of delay amounts corresponding to error signals having maximum values adjacent to each other, and sending the intermediate delay amount to said variable delay circuit, to thereby reduce the error signal output from said error measuring unit.

* * * * *